US008946895B2

(12) United States Patent
Kato et al.

(10) Patent No.: US 8,946,895 B2
(45) Date of Patent: Feb. 3, 2015

(54) SEMICONDUCTOR DEVICE, MANUFACTURING METHOD OF SEMICONDUCTOR DEVICE, SEMICONDUCTOR MANUFACTURING AND INSPECTING APPARATUS, AND INSPECTING APPARATUS

(75) Inventors: Takahiko Kato, Hitachinaka (JP); Hiroshi Nakano, Tokai (JP); Haruo Akahoshi, Hitachi (JP); Yuuji Takada, Kawasaki (JP); Yoshimi Sudo, Akiruno (JP); Tetsuo Fujiwara, Hitachinaka (JP); Itaru Kanno, Takarazuka (JP); Tomoryo Shono, Kawanishi (JP); Yukinori Hirose, Suita (JP)

(73) Assignee: Renesas Electronics Corporation, Kanagawa (JP)

( * ) Notice: Subject to any disclaimer, the term of this patent is extended or adjusted under 35 U.S.C. 154(b) by 651 days.

(21) Appl. No.: 12/389,479

(22) Filed: Feb. 20, 2009

(65) Prior Publication Data
US 2009/0218694 A1 Sep. 3, 2009

(30) Foreign Application Priority Data
Feb. 28, 2008 (JP) ................................ 2008-047675

(51) Int. Cl.
*H01L 23/48* (2006.01)
*H01L 23/532* (2006.01)
*H01L 21/768* (2006.01)

(52) U.S. Cl.
CPC .... *H01L 23/53238* (2013.01); *H01L 21/76843* (2013.01); *H01L 21/76873* (2013.01); *H01L 21/76877* (2013.01); *H01L 23/53295* (2013.01)
USPC .................................. 257/751; 257/E23.161

(58) Field of Classification Search
CPC ............ H01L 21/02697; H01L 21/481; H01L 21/485; H01L 21/52; H01L 21/535
USPC .......................................... 257/751, E23.161
See application file for complete search history.

(56) References Cited

U.S. PATENT DOCUMENTS

| 5,709,958 | A | 1/1998 | Toyoda et al. |
| 6,174,810 | B1 | 1/2001 | Islam et al. |
| 6,670,639 | B1* | 12/2003 | Okabayashi et al. ........... 257/64 |

(Continued)

FOREIGN PATENT DOCUMENTS

| JP | 2001-068475 | | 3/2001 |
| JP | 2001-85430 | A | 3/2001 |
| JP | 2002-75995 | A | 3/2002 |
| JP | 2002-367999 | | 12/2002 |
| JP | 2005-93884 | A | 4/2005 |
| JP | 2007-281485 | A | 10/2007 |

(Continued)

*Primary Examiner* — Wael Fahmy
*Assistant Examiner* — Sarah Salerno
(74) *Attorney, Agent, or Firm* — Mattingly & Malur, PC

(57) ABSTRACT

A semiconductor device having Cu wiring including a basic crystal structure which can reduce surface voids, and an inspecting technique for the semiconductor device. In the semiconductor device, surface voids can be reduced down to $1/10$ or less of a current practical level by specifying a barrier layer and a seed layer and setting a proportion (frequency) of occupation of a coincidence site lattice (CSL) boundary having a grain boundary Sigma value 27 or less to all crystal grain boundaries of a Cu wiring to 60% or higher. Alternatively, a similar effect of surface void reduction can be obtained by specifying a barrier layer and a seed layer and setting a proportion (frequency) of occupation of a coincidence site lattice (CSL) boundary having a grain boundary Sigma value 3 to all crystal grain boundaries of a Cu wiring to 40% or higher.

2 Claims, 19 Drawing Sheets

(56) References Cited

U.S. PATENT DOCUMENTS

| | | |
|---|---|---|
| 2002/0024142 A1 | 2/2002 | Sekiguchi |
| 2006/0113675 A1 | 6/2006 | Chang et al. |
| 2006/0124026 A1* | 6/2006 | Kollodge ........................ 106/3 |
| 2006/0201589 A1* | 9/2006 | Morales et al. ............... 148/423 |

FOREIGN PATENT DOCUMENTS

| | | |
|---|---|---|
| TW | I256677 B | 6/2006 |
| WO | 2006/137237 A1 | 12/2006 |
| WO | WO 2008084867 A1 * | 7/2008 |

* cited by examiner

STEM (VOIDS WITHIN WIRING)

FIG. 13

| SAMPLE | #8 Ru-BASE BARRIER, Cu-Al SEED | #7 Ta-BASE BARRIER, Cu-Al SEED |
|---|---|---|
| ORIENTATION OF BARRIER LAYER | (002) ORIENTATION | Ta(330)(331) ORIENTATIONS |
| ORIENTATION OF SEED LAYER | (111) ORIENTATION 91% | (111) ORIENTATION 96% |
| ORIENTATION OF Cu-PLATED LAYER (250°C ANNEALING MATERIAL) | (111) ORIENTATION 44%, (200) ORIENTATION 54% | (111) ORIENTATION 93%, (200) ORIENTATION 1% |
| CSL BOUNDARY FREQUENCY OF Cu-PLATED LAYER | 61~72% | 63~78% |
| VOID DENSITY OF Cu-PLATED LAYER CSL BOUNDARY FREQUENCY REACHING 0.5×10⁶ pieces/cm² | ABOUT 75% | ABOUT 65% |

CSL BOUNDARY FREQUENCY = 60 TO 83%

CSL BOUNDARY FREQUENCY = 33 TO 59%

SEM IMAGE (ACCELERATING VOLTAGE <5KV)

(111): GRANULATED SURFACE SHAPE, CONTRAST WHITE
(511): GRANULATED SURFACE SHAPE, CONTRAST DARK
(001) FLAT SHAPE
(211) STREAKY SURFACE SHAPE, CONTRAST DARK

EBSP MEASUREMENT RESULT CORRESPONDING TO THE SEM IMAGE ON THE LEFT

MEASUREMENT MODE: CRYSTAL DIRECTION FIGURE (NORMAL DIRECTION)

SEM IMAGE (ACCELERATING VOLTAGE < 5kV)

EBSP MEASUREMENT RESULT CORRESPONDING TO THE SEM IMAGE ON THE LEFT

MEASUREMENT MODE: INVERSE OLE FIGURE (NORMAL DIRECTION)

FIG. 19

| SAMPLE No. | BARRIER LAYER | SEED LAYER | PLATING SOLUTION[1] | Cu LAYER IMPURITY CONCENTRATION | CRYSTALLIZATION ANNEALING TEMPERATURE | ANNEALING RATE[2] | CMP BEFORE EVALUATION[3] |
|---|---|---|---|---|---|---|---|
| #1 | Ta[4] | Cu | E-1 | HIGH | 400°C | Q | DONE |
| #2 | Ta[4] | Cu | E-1 | LOW | 400°C | Q | DONE |
| #3 | Ta[4] | Al-CONTAINED Cu | E-1 | LOW | 400°C | Q | DONE |
| #4 | Ta[4] | Cu | E-1 | LOW | 250~300°C | Q | DONE |
| #5 | Ta[4] | Al-CONTAINED Cu | E-1 | LOW | 250~300°C | Q | DONE |
| #6 | Ta[4] | Al-CONTAINED Cu | E-2 | LOW | 250~300°C | Q | DONE |
| #7 | Ta[4] | Al-CONTAINED Cu | E-2 | LOW | 250~300°C | L | DONE |
| #8 | Ru[5] | Al-CONTAINED Cu | E-2 | LOW | 250~300°C | L | DONE |
| #9 | Ru[5] | NONE | E-2 | LOW | 250~300°C | L | DONE |

1) E-1: SULFURIC ACID AQUEOUS SOLUTION CONTAINING COPPER SULFATE OF AT LEAST ABOUT 10% AND ADDITIVE A
   (ADDITIVE A: HIGH-MOLECULAR-WEIGHT ORGANIC POLYMER OF LESS THAN 1% + METHANOL OF LESS THAN 1% + REMNANT WATER)
   E-2: SULFURIC ACID AQUEOUS SOLUTION CONTAINING COPPER SULFATE OF AT LEAST ABOUT 10% AND ADDITIVE B
   (ADDITIVE B: LOW-MOLECULAR-WEIGHT ORGANIC POLYMER OF LESS THAN 1% + METHANOL OF LESS THAN 1% + REMNANT WATER)
2) Q: RAPID HEATING + SHORT TIME ANNEALING + RAPID TEMPERATURE FALLING
   L: SLOW HEATING + LONG TIME ANNEALING + SLOW TEMPERATURE FALLING
3) EVALUATION: GRAIN BOUNDARY CHARACTERISTICS EVALUATION AND VOID FORMATION AMOUNT EVALUATION
4) Ta DISPLAY INCLUDES TWO KINDS OF CASES: Ta CRYSTAL SINGLE LAYER IS USED;
   AND CRYSTAL COMPOSITE LAYER OF Ta/TaN IS USED
5) Ru DISPLAY INCLUDES TWO KINDS OF CASES: Ru CRYSTAL SINGLE LAYER IS USED;
   AND CRYSTAL COMPOSITE LAYER OF Ru/RuN IS USED

SEMICONDUCTOR DEVICE, MANUFACTURING METHOD OF SEMICONDUCTOR DEVICE, SEMICONDUCTOR MANUFACTURING AND INSPECTING APPARATUS, AND INSPECTING APPARATUS

CROSS-REFERENCE TO RELATED APPLICATION

The present application claims priority from Japanese Patent Application No. JP 2008-047675 filed on Feb. 28, 2008, the content of which is hereby incorporated by reference into this application.

TECHNICAL FIELD OF THE INVENTION

The present invention relates to a semiconductor device and a technique for inspecting the same. More particularly, the present invention relates to a technique effectively applied to a semiconductor device including at least one layer of Cu wiring provided in an insulating layer provided on a semiconductor substrate via a composite layer formed of a barrier layer and a seed layer on the barrier layer and provided between the Cu wiring (interconnect) and the insulating layer.

BACKGROUND OF THE INVENTION

It has been a long time since scaling design of LSI wiring aiming high integration of LSI has become world trend, but problems such as an increases in signal transmission delay and Joule loss due to an increase in wiring resistance and wiring disconnection/short-circuiting due to electro migration and the like have become apparent in the history of miniaturization of wiring, which has resulted in changes of materials to be used for wiring. In 1997, chips using copper (Cu) wirings as a wiring material instead of aluminum (Al) and aluminum alloy which have been used in LSIs until then appeared in the world, and the world has headed to development for putting a fine Cu wiring into practical use under the inspiration of the chips using Cu. Since the Cu wiring has features such as (1) low resistance, (2) high electro migration resistance, (3) high melting point, and the like, it is superior to the Al wiring regarding miniaturization, and application thereof to actual products has been expected for a long time. In addition, a wiring formation process such as wiring formation by utilizing chemical mechanical polishing (CMP) process and plating process have appeared in order to realize practical use of the Cu wiring and such a wiring formation process currently becomes one of processes generally inevitable for manufacturing. As an example of a semiconductor device having such a Cu wiring, there is a semiconductor device having a multi-layer Cu wiring structure.

On the other hand, as shown in Semiconductor Industry Association (SIA): ITRS (The International Technology Roadmap for Semiconductors) 2003, or Japan Electronics and Information Technology Industries Association's Semiconductor Technology Roadmap committee of Japan: International Semiconductor Technology Roadmap 2003 Edition (Japanese Translation), semiconductor Cu wiring being currently under development for commercialization is being shifting from 90 nm node to 45 nm node through 65 nm node according to the LSI wiring design rule by ITRS. A roadmap where the node reaching 45 nm to 32 nm after 2010 is also shown.

However, as scaling of wirings advances, as well as problems of reliability lowering in wirings caused by electro migration: EM and stress migration: SM have come to the front also in Cu wiring, as a problem on manufacturing technology, there has been a growing possibility that minute voids are formed on a surface of a wiring after CMP in the stage of manufacturing LSI, which can result in a critical void leading to wiring disconnection along with reduction of wiring width. Since such surface voids decrease yields resulting in a problem directly linked with manufacturing cost and performance, development of void-reducing technique is one of challenges essential in manufacturing to realize the wiring scaling.

In a manufacturing process of LSI associated with high integration as described above, the so-called damascene process where, after Cu is buried in an insulating layer previously formed with trenches by electroplating process, excessive Cu (overlay portion) other than Cu in trenches for wiring formation is removed using CMP so that wirings are formed has been put in practical use and spreading as a basic technique for microfabrication. Also, to the damascene process, a structure in which a barrier layer for preventing Cu diffusion from a Cu wiring to a silicon semiconductor and a seed layer of such as pure Cu or Cu alloy to serve as a seed for electroplating Cu wiring formation are applied to inside of a trench in an insulating layer has been generally adopted. Build-in elemental technologies for a wiring consistent with the wiring node as technologies to enable manufacture of LSI have been sequentially developed in the history of the Cu wiring manufacturing technique in each node width generation, for example, as read in Japanese Patent Application Laid-Open Publication No. 2001-068475 (Patent Document 1) and Japanese Patent Application Laid-Open Publication No. 2002-367999 (Patent Document 2).

SUMMARY OF THE INVENTION

However, the elementary techniques are manufacturing techniques for building-in a practically usable wiring shape for each wiring generation, and they do not provide essential void-control techniques for universally maintaining a low density of surface voids on a wiring. Therefore, there has been such a problem that Cu plating conditions, following annealing conditions, conditions for wiring stacking process/design, selection and formation conditions of materials for a barrier layer and a seed layer, and the like for wiring formation must be built in at each stage of progress of wiring scaling through a trial and error process in consideration of dependence properties specific to manufacturing apparatuses.

In view of these circumstances, the present invention has solved problems such as those mentioned above and a representative object thereof is to provide a semiconductor device having a Cu wiring provided with a basic crystal structure which can reduce surface voids down to a level further lower than a practical level, which is not affected by transition of wiring widths by ascertaining an essential cause of minute voids formed on a Cu wiring surface in a manufacture stage of current and subsequent LSI generations, and a technique for inspecting the same.

The above and other objects and novel characteristics of the present invention will be apparent from the description of the present specification and the accompanying drawings.

The typical ones of the inventions disclosed in the present application will be briefly described as follows.

That is, an outline of a representative invention lies in a semiconductor device comprising a Cu wiring provided by at least one layer or more in insulating layers provided on a semiconductor substrate via a composite layer formed of a barrier layer and a seed layer on the barrier layer and provided between the Cu wiring and the insulating layer, where the barrier layer and the seed layer are specified and a proportion (frequency) of a coincidence (CSL: coincidence site lattice) boundary having a grain boundary Sigma (Σ) value=27 or less in all crystal grain boundaries of the Cu wiring is set to 60% or more, thereby reducing surface voids down to 1/10 or less of a current level practically usable.

Alternately, in the semiconductor device, a similar effect of surface void reduction can be obtained by specifying the barrier layer and the seed layer and setting a proportion (frequency) of a coincidence (CSL) boundary having a grain boundary Σ value=3 to 40% or more.

The Cu wiring of the semiconductor device having reduced surface voids can be formed by electroplating. As a configuration of the semiconductor device having reduced surface voids, the semiconductor device can be provided with a semiconductor substrate, an insulating layer provided on the semiconductor substrate, and a plurality of Cu wirings at the same level provided in the insulating layer. Alternately, a multilayer structure where the plurality of Cu wirings at the same level are vertically stacked in the insulating layer can be provided.

A mobile phone and a portable electronic apparatus can be manufactured using an electronic part comprising the semiconductor device as a constituent part. An apparatus for automobile and an automobile can be manufactured using an electronic part comprising the semiconductor device as a constituent part.

Further, in a manufacturing and inspecting apparatus of a semiconductor device, a novel semiconductor manufacturing and inspecting apparatus provided with a step of examining grain boundary characteristics of a Cu wiring configuring a semiconductor device can be provided. In the manufacturing and inspecting apparatus of a semiconductor device, the step of examining a grain boundary characteristics of a Cu wiring configuring a semiconductor device can be performed using an electron backscattering diffraction pattern (EBSP) method, a scanning electron microscope with an accelerating voltage of 5 kV or less, a scanning ion microscope, a transmission electron microscope, an atomic force microscope, and the like.

The effects obtained by typical aspects of the present invention will be briefly described below.

That is, according to an effect obtained by the representative invention, a semiconductor device comprising a Cu wiring provided with a basic crystal structure which can achieve such an effect that surface voids on the Cu wiring can be reduced to 1/10 or less of that in the conventional art by using a Cu wiring having a grain boundary frequency where a CSL grain boundary is 60% or more or Sigma 3 grain boundary is 40% or more, and suppresses grain boundary void formation to cause surface voids can be provided.

BRIEF DESCRIPTIONS OF THE DRAWINGS

Figure 5:
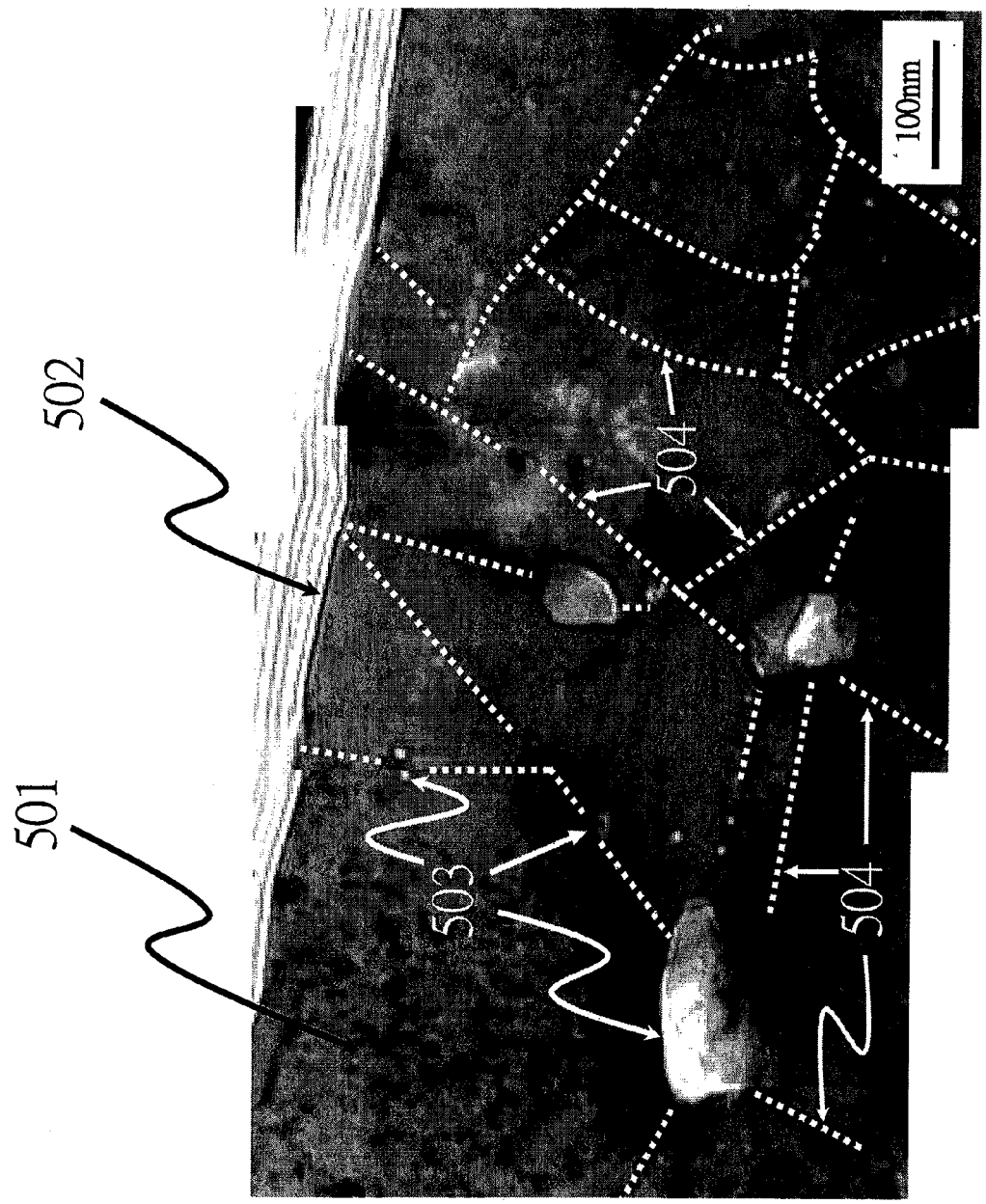
Figure 6A:
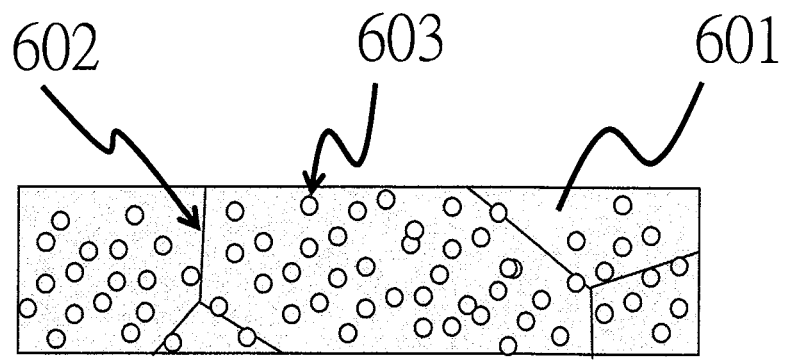
Figure 6B:
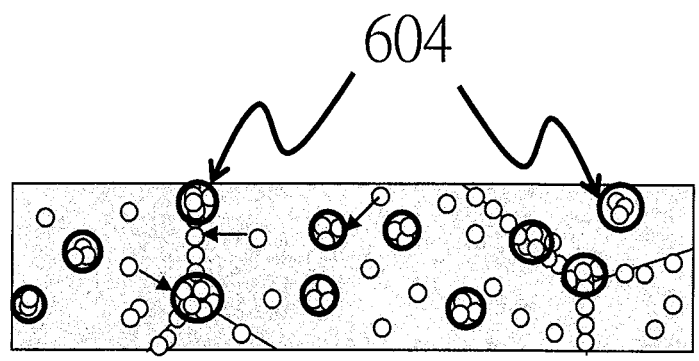
Figure 6C:
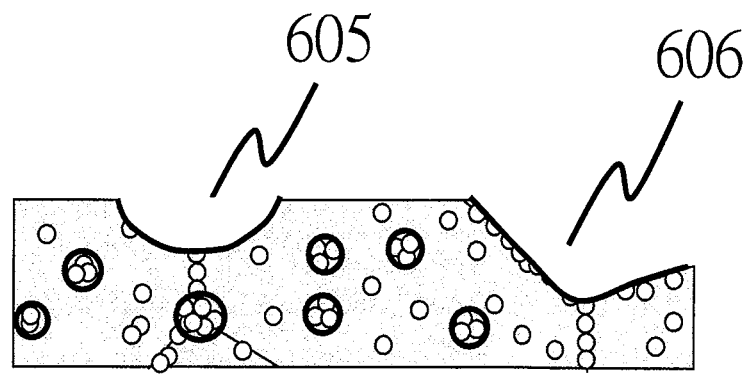
Figure 7:
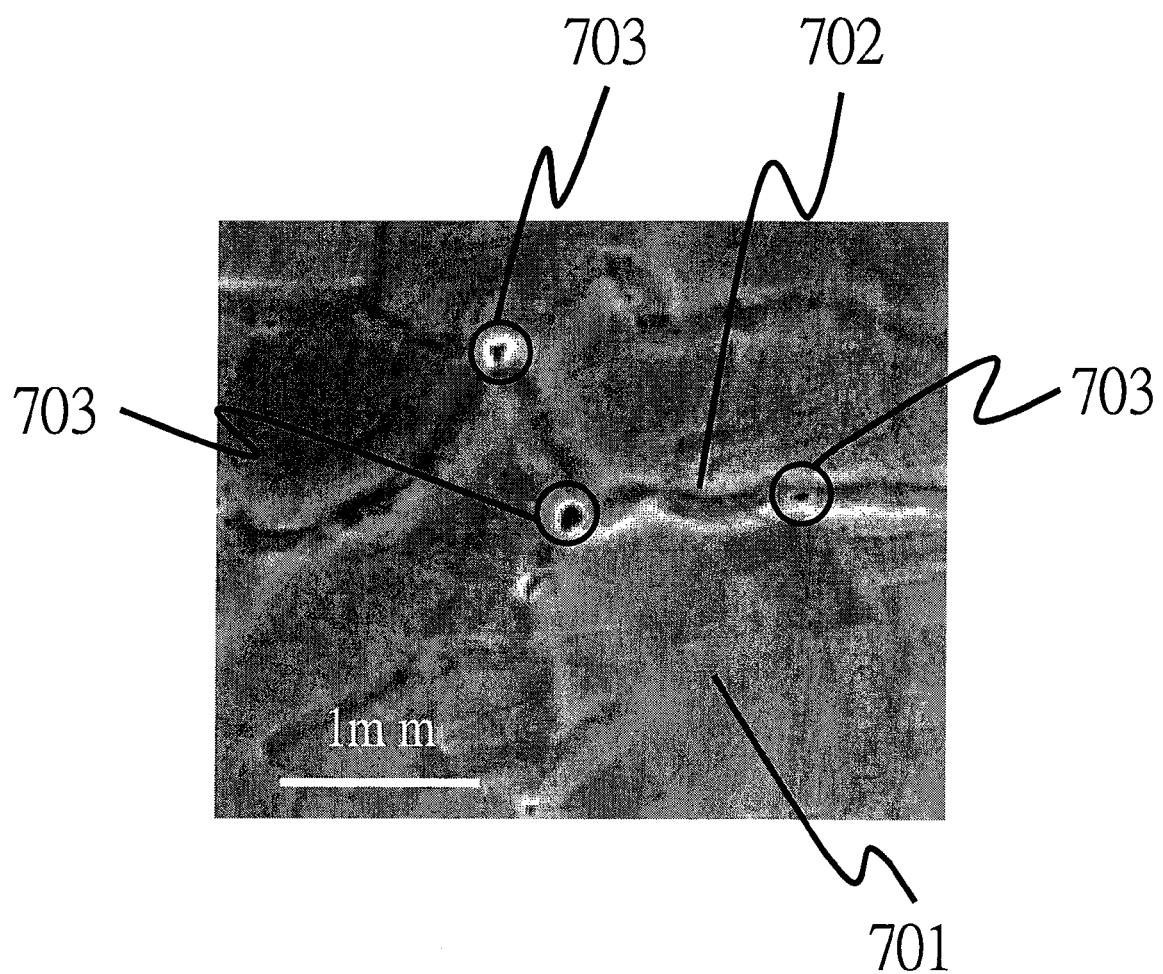
Figure 8A:
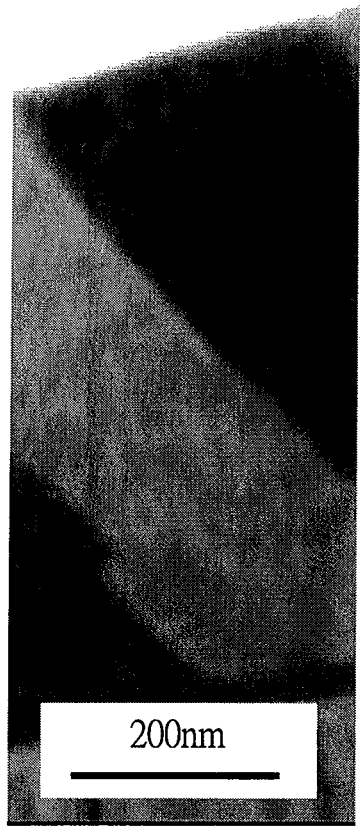
Figure 8B:
Figure 8C:
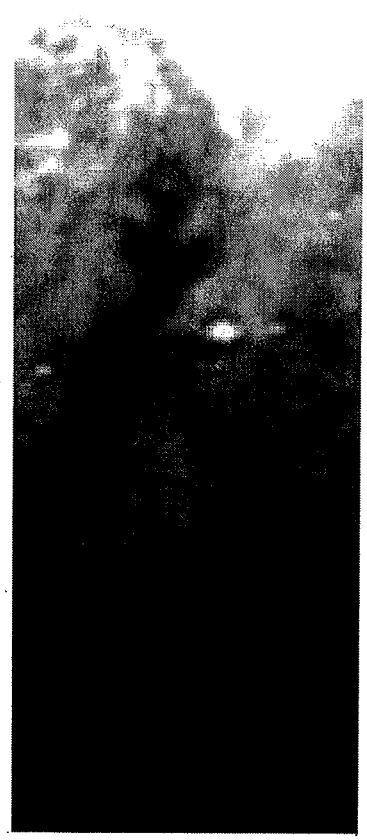
Figure 9:
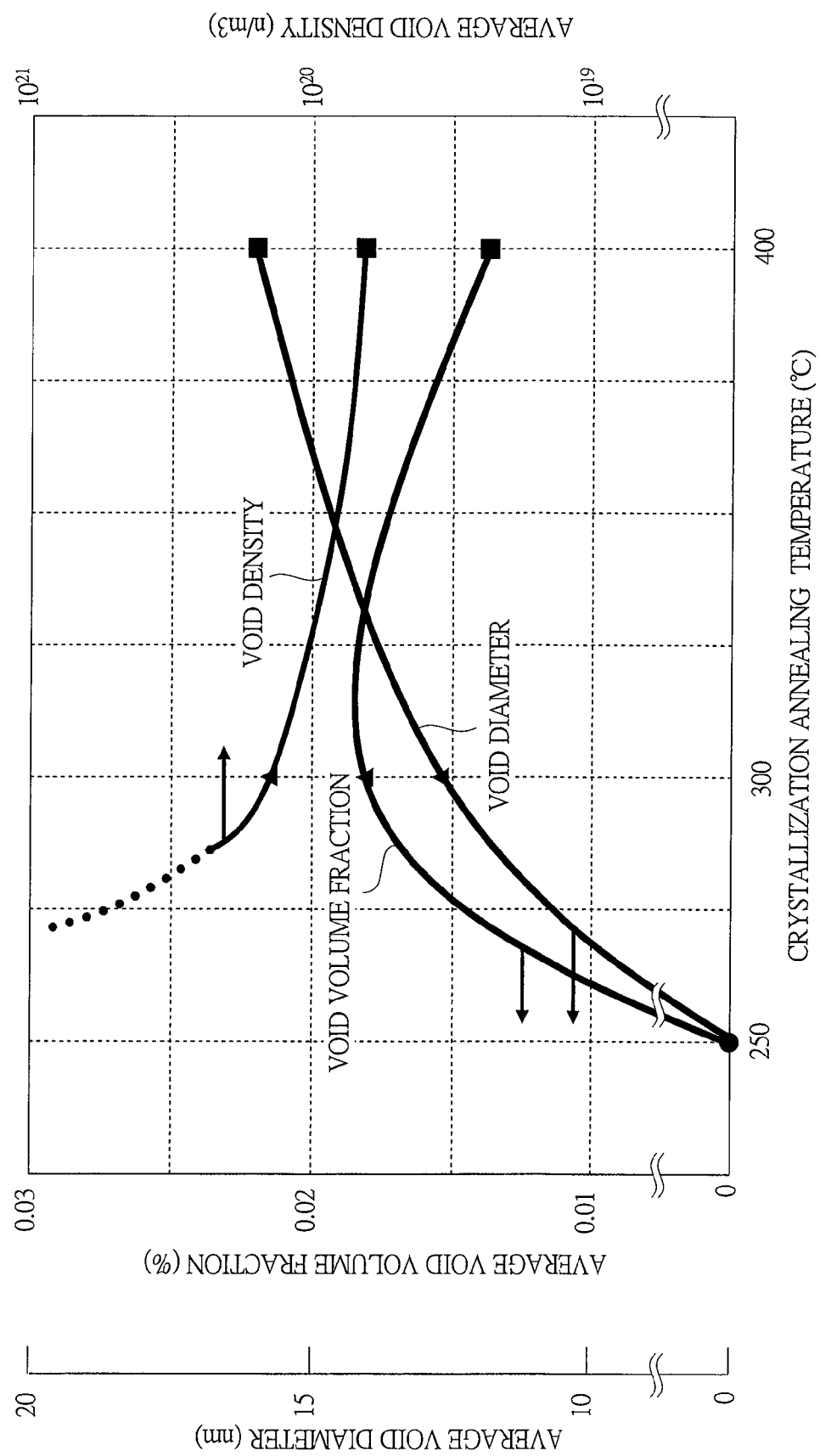
Figure 10:
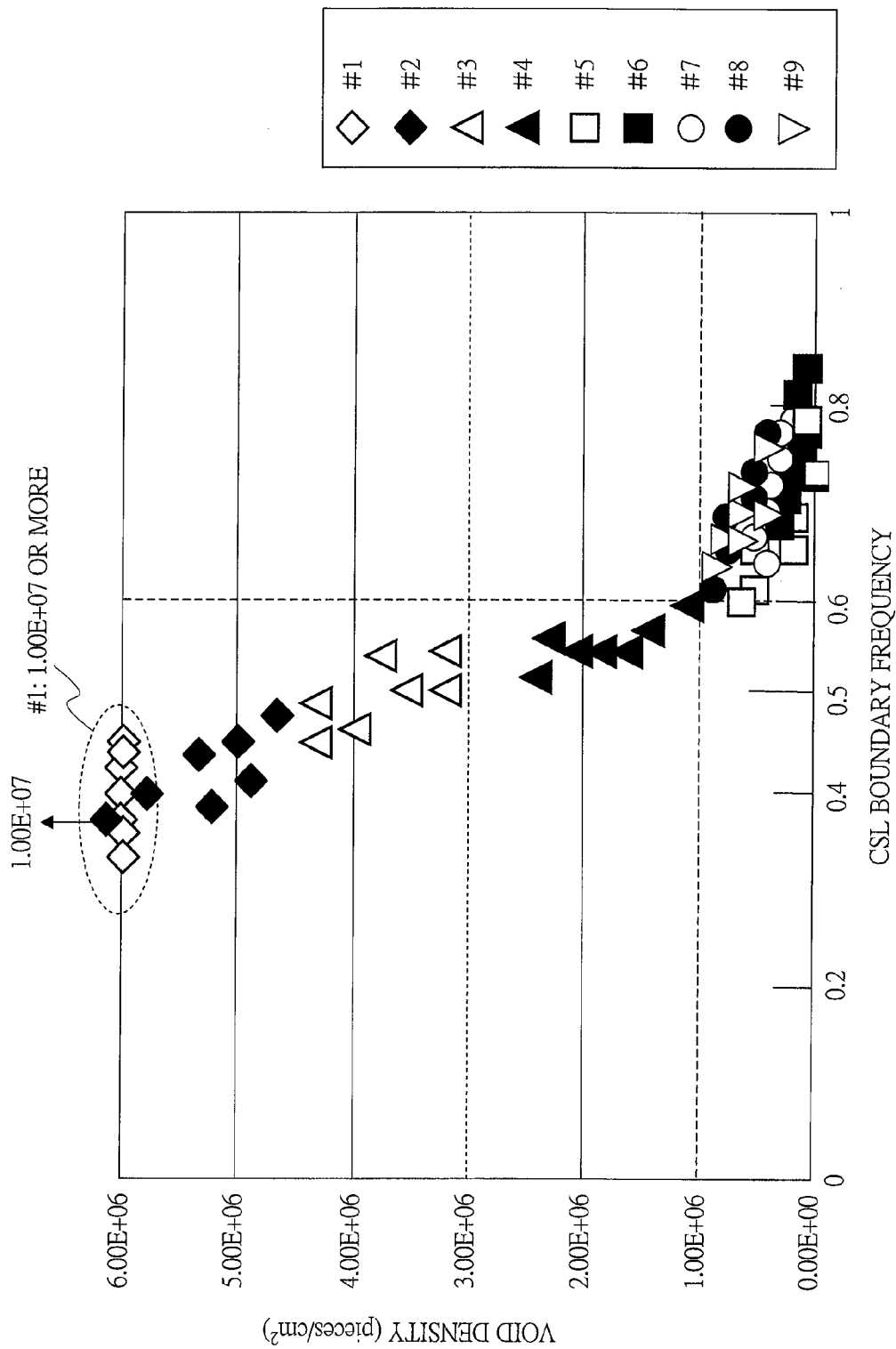
Figure 11:
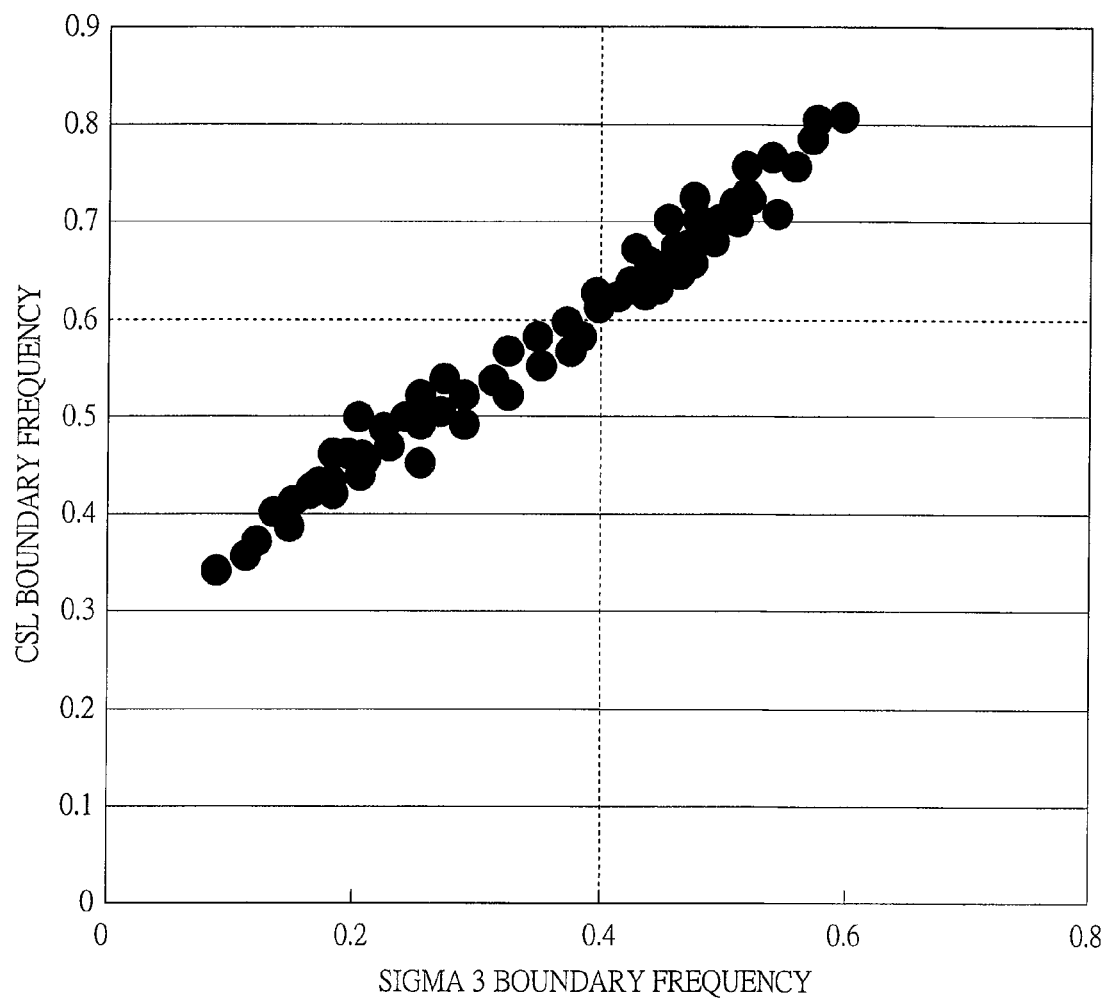
Figure 12:
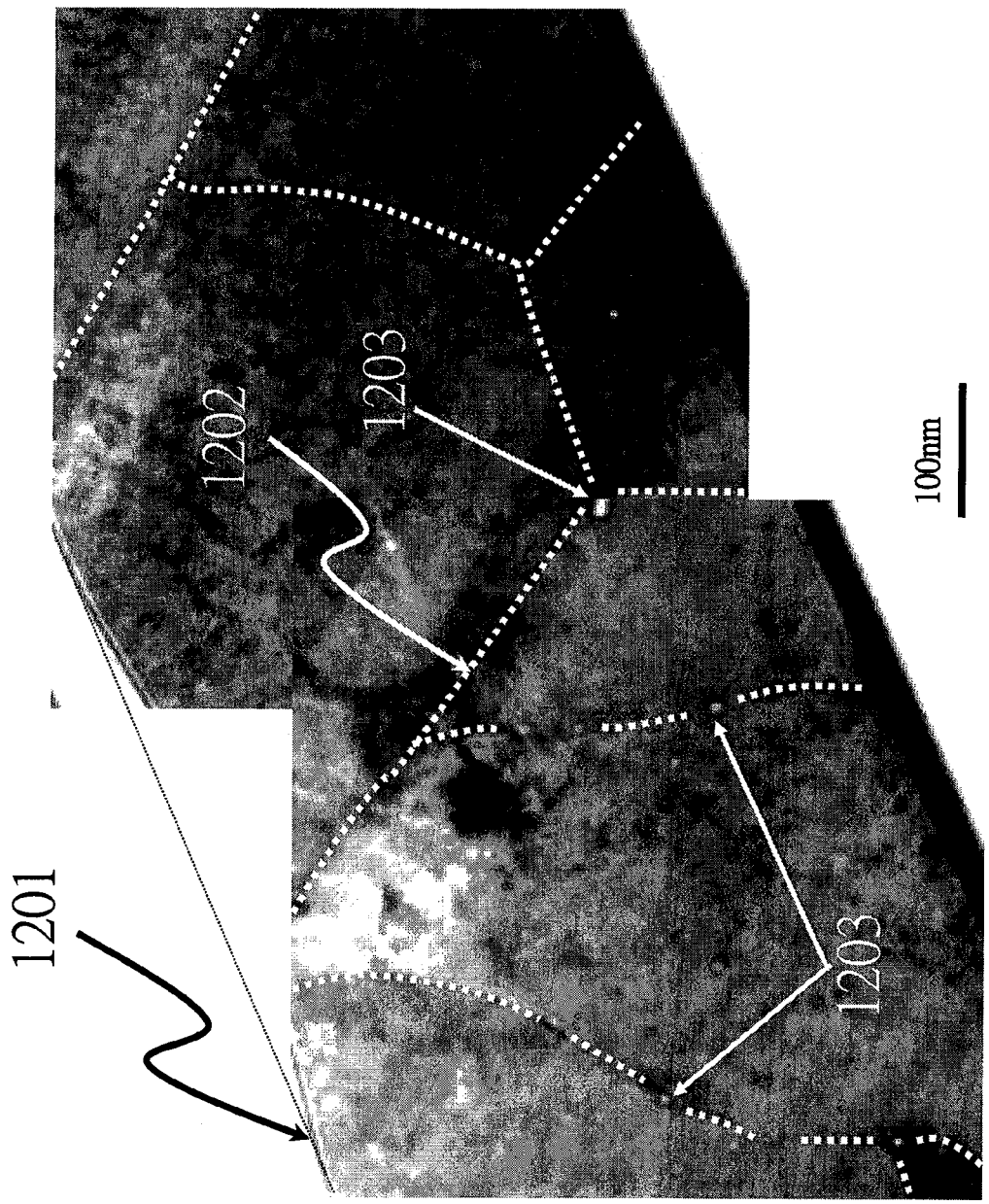
Figure 14:
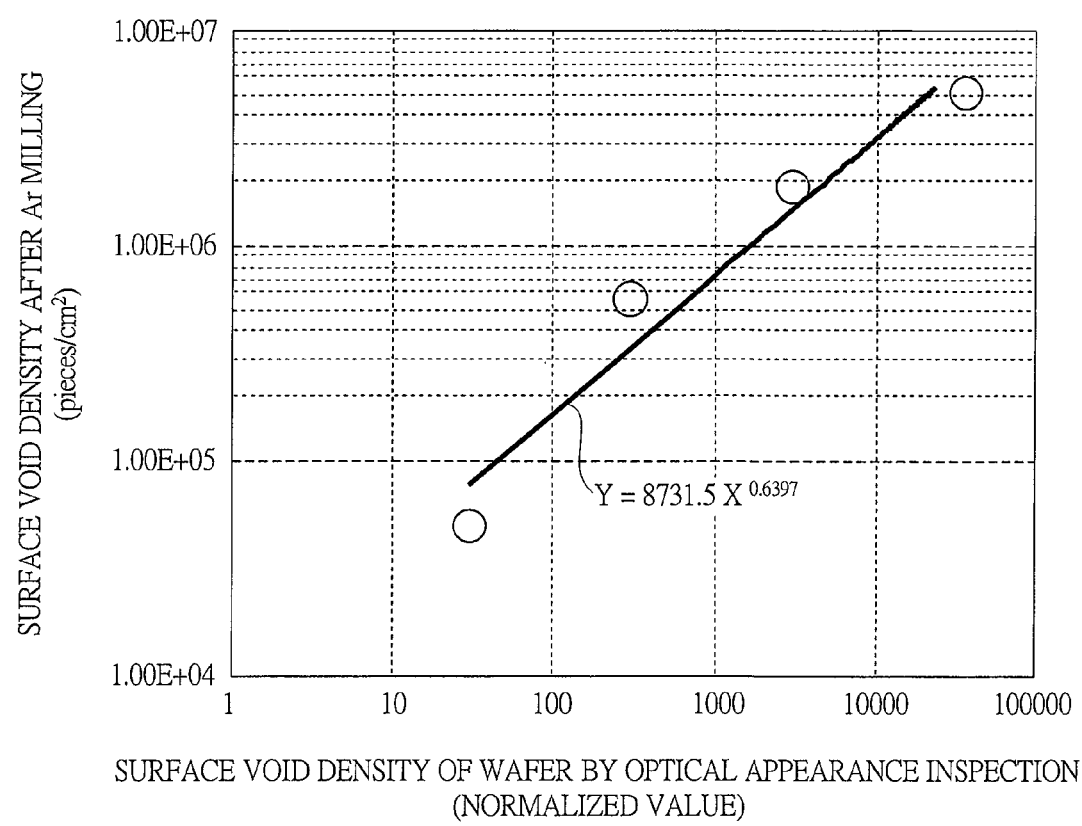
Figure 15B:
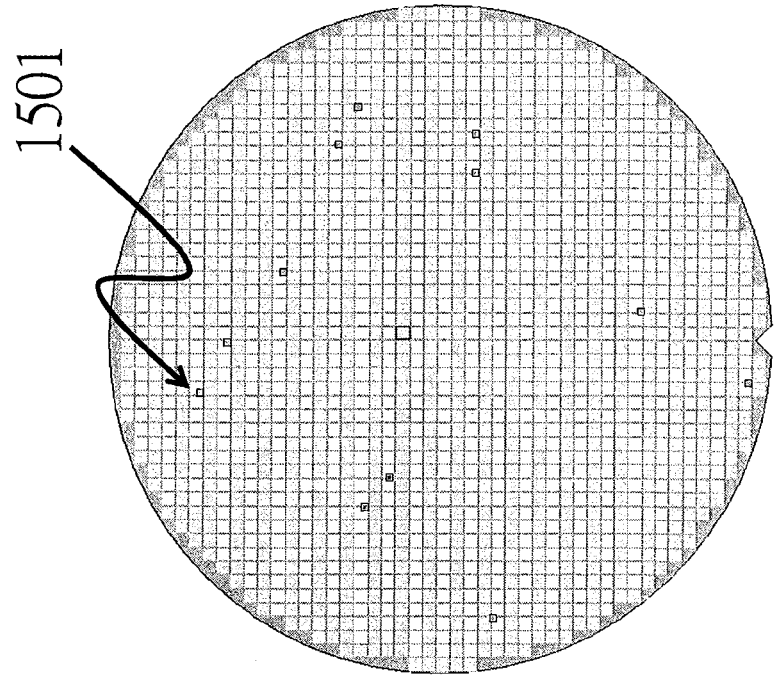
Figure 15A:
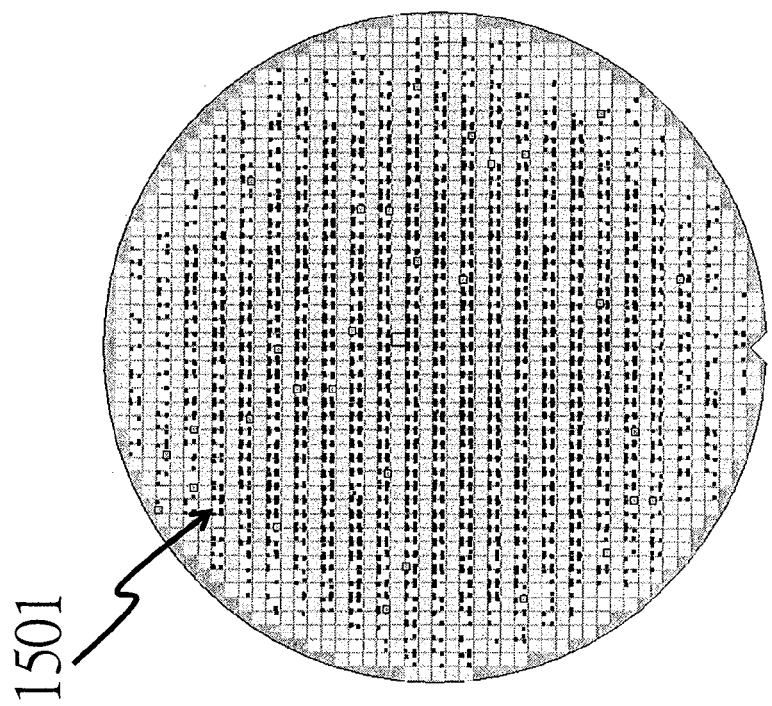
Figure 16A:
Figure 16B:
Figure 17A:
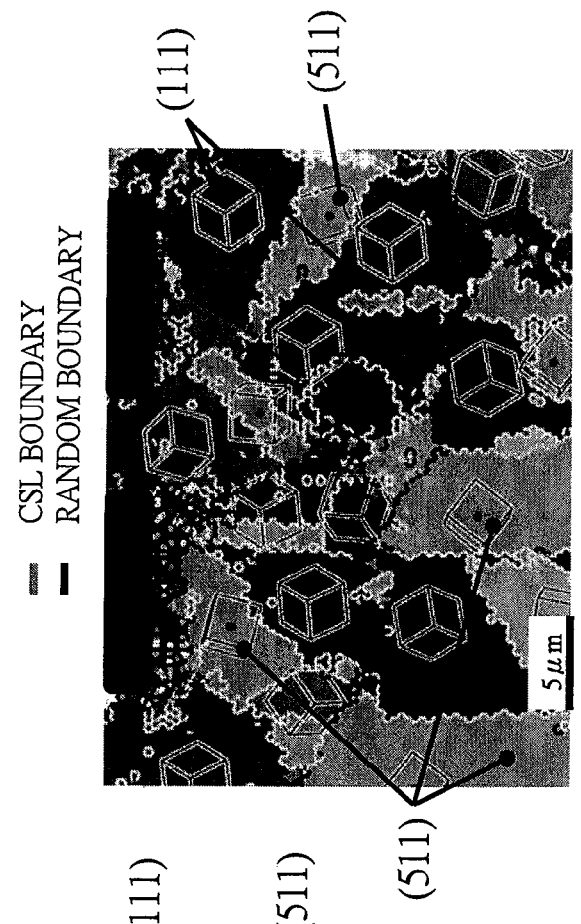
Figure 17B:
Figure 18:
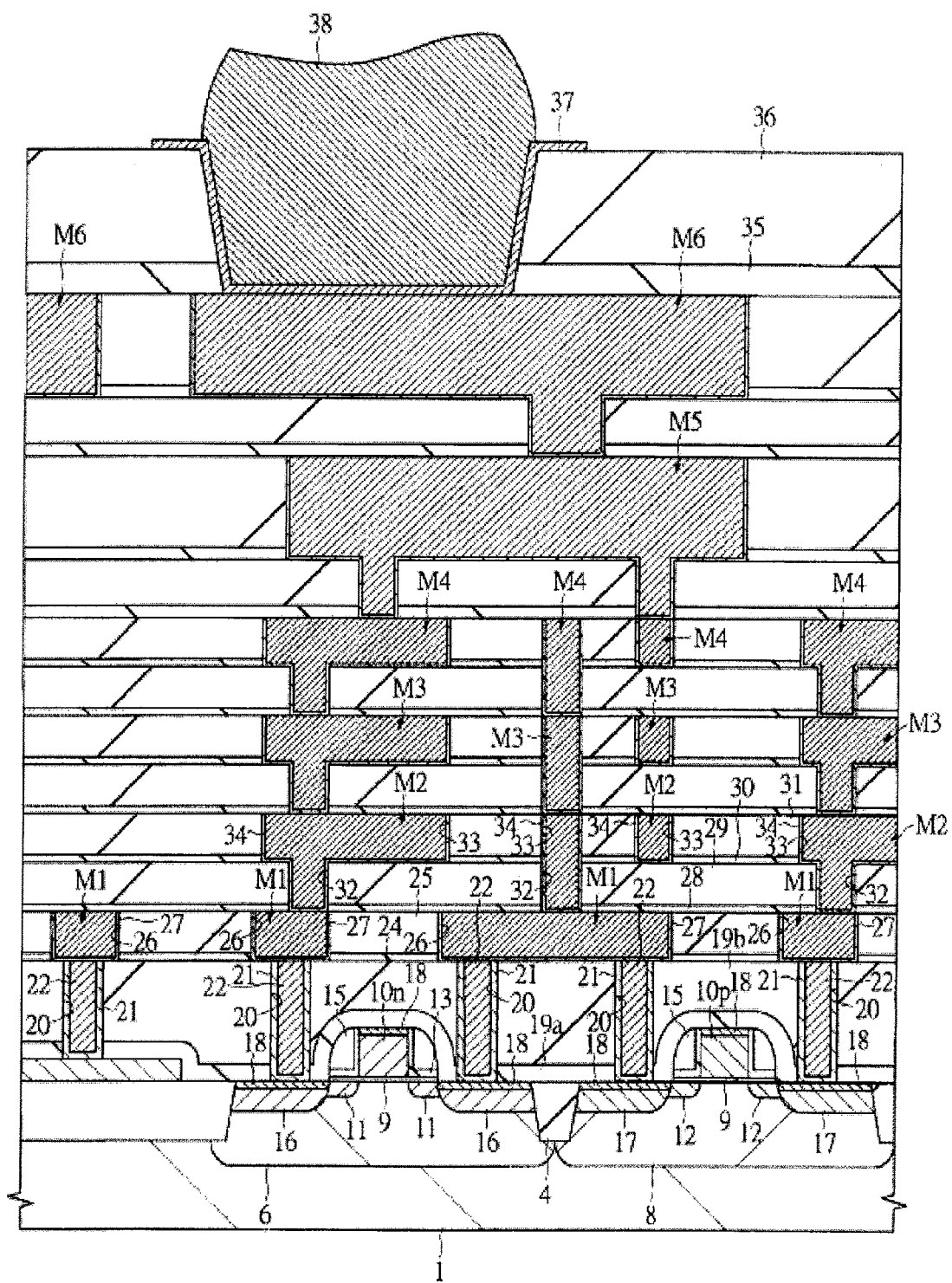

FIG. 5 is a diagram showing a TEM observation result of a cross section (including an overlay portion) of a Cu wiring including an impurity with a high concentration and formed on a semiconductor wafer according to an embodiment of the present invention FIG. 6A is a cross-sectional view of a wiring for describing a surface void generation mechanism of an electroplated Cu wiring according to an embodiment of the present invention;

FIG. 6B is a cross-sectional view of the wiring for describing the surface void generation mechanism of the electroplated Cu wiring according to the embodiment of the present invention;

FIG. 6C is a cross-sectional view of the wiring for describing the surface void generation mechanism of the electroplated Cu wiring according to the embodiment of the present invention;

FIG. 7 is a diagram showing a SEM observation result after surface voids on an electroplated Cu wiring are applied with surface Ar ion milling before a CMP processing according to an embodiment of the present invention;

FIG. 8A is a diagram showing a TEM observation on temperature change of micro void formation behavior within an electroplated Cu wiring according to an embodiment of the present invention;

FIG. 8B is a diagram showing a TEM observation on temperature change of micro void formation behavior within the electroplated Cu wiring according to an embodiment of the present invention;

FIG. 8C is a diagram showing a TEM observation on temperature change of micro void formation behavior within the electroplated Cu wiring according to an embodiment of the present invention;

FIG. 9 is a diagram showing an annealing temperature dependency of the micro void formation behavior within an electroplated Cu wiring according to an embodiment of the present invention;

FIG. 10 is a diagram showing a relationship between a surface void density and a CSL boundary frequency of a Cu wiring according to an embodiment of the present invention;

FIG. 11 is a diagram showing a correlation between a CSL boundary frequency and a Sigma 3 grain boundary frequency of a Cu wiring according to an embodiment of the present invention;

FIG. 12 is a diagram showing a TEM observation result of a section (including an overlay portion) of a Cu wiring including impurity with a low concentration and formed on a semiconductor waver according to an embodiment of the present invention;

FIG. 13 is a diagram showing an identification result of crystallinities of a barrier layer, a seed layer, and a Cu plating layer obtained by an X-ray diffraction process according to an embodiment of the present invention;

FIG. 14 is a diagram showing a correlation between a surface void density after an Ar trimming and a surface void density of a wafer obtained by optical appearance inspection according to an embodiment of the present invention;

FIG. 15A is a diagram showing a comparison between a conventional product and a product of the present invention obtained by an optical appearance inspection of a Cu wiring formed on a semiconductor wafer according to an embodiment of the present invention;

FIG. 15B is a diagram showing the comparison between a conventional product and the product of the present invention obtained by an optical appearance inspection of the Cu wiring formed on the semiconductor wafer according to the embodiment of the present invention;

FIG. 16A is a diagram showing a comparison between a SEM image of a Cu wiring surface portion observed at an accelerating voltage of 5 kV or less and an EBSP measurement result according to an embodiment of the present invention;

FIG. 16B is a diagram showing a comparison between the SEM image of the Cu wiring surface portion observed at an accelerating voltage of 5 kV or less and the EBSP measurement result according to the embodiment of the present invention;

FIG. 17A is a diagram showing a comparison of Cu wiring surface portion grain boundary characteristics identified from a SEM image of accelerating voltage of 5 kV or less according to an embodiment of the present invention;

FIG. 17B is a diagram showing the comparison of Cu wiring surface portion grain boundary characteristics identified from an EBSP measurement in the same area with FIG. 17A according to the embodiment of the present invention;

FIG. 18 is a diagram showing a section of a semiconductor device of an example according to an embodiment of the present invention; and FIG. 19 is a diagram showing production conditions of samples utilized for measuring CSL boundary frequencies according to an embodiment of the present invention.

DESCRIPTIONS OF THE PREFERRED EMBODIMENTS

A study by the inventors of the present invention and discoveries obtained from the study which led to the present invention will be described in detail with reference to the specific drawings, and embodiments of the present invention will be described.

Three Discoveries of the Present Invention

The present invention has been made as finding a basic Cu crystal structure capable of reducing Cu wiring surface voids according to the following three discoveries. That is, the first discovery is that minute voids (hereinafter, called "surface voids") formed on a Cu wiring surface are posed by formation of micro voids mainly formed at crystal grain boundaries of a Cu wiring and observable at the transmission electron microscope level; the second discovery is that formation of micro voids at the Cu wiring grain boundary has a correlation with properties of grain boundary (called "grain boundary characteristics"); and the third discovery is that surface voids can be reduced down to a level considerably lower than surface voids in a practical level by controlling grain boundary characteristics.

These three discoveries will be described in detail below.

First Discovery

Figure 1:
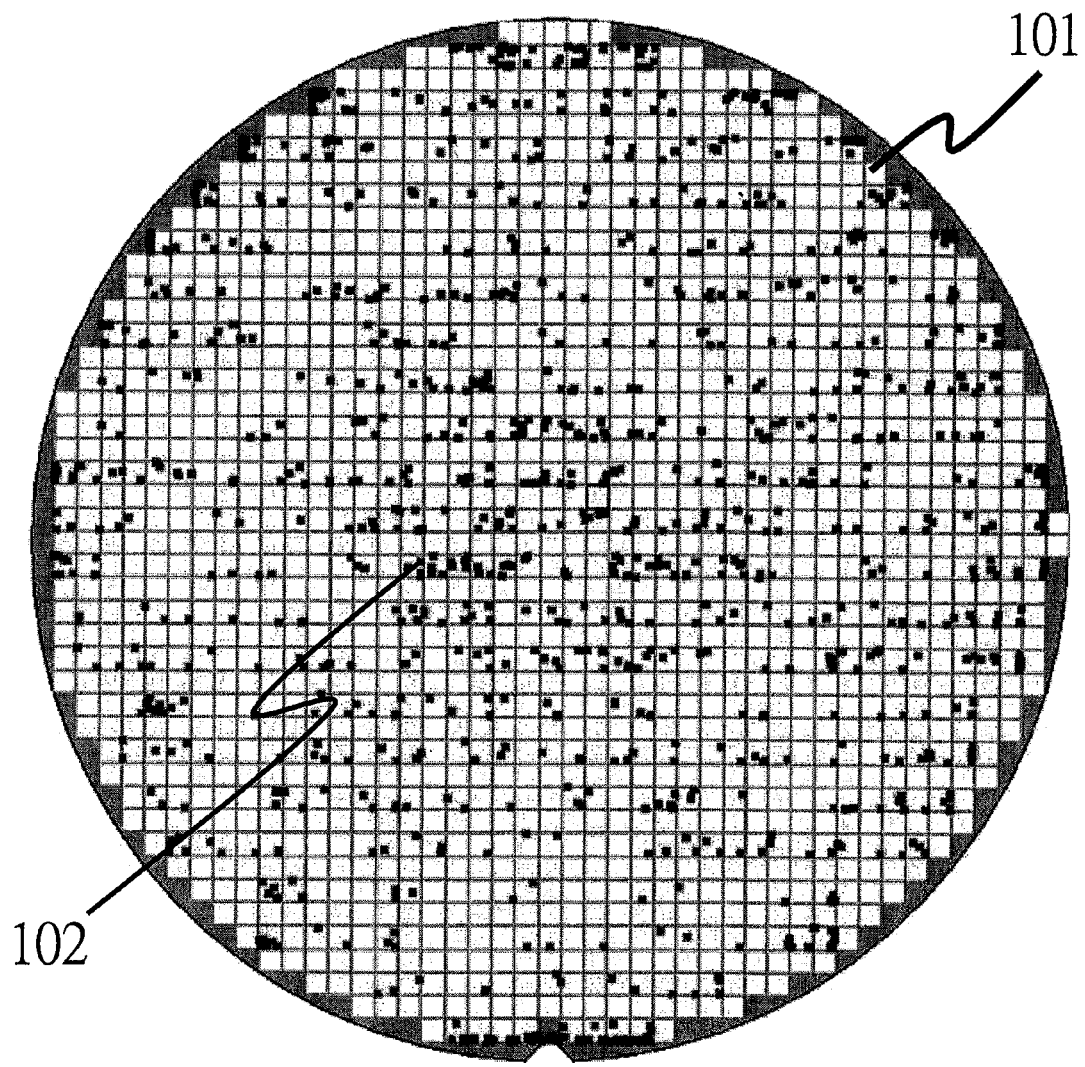
FIG. 1 is a diagram showing one example of a result of an optical appearance inspection on a Cu wiring formed on a semiconductor wafer according to an embodiment of the present invention.
Figure 2:
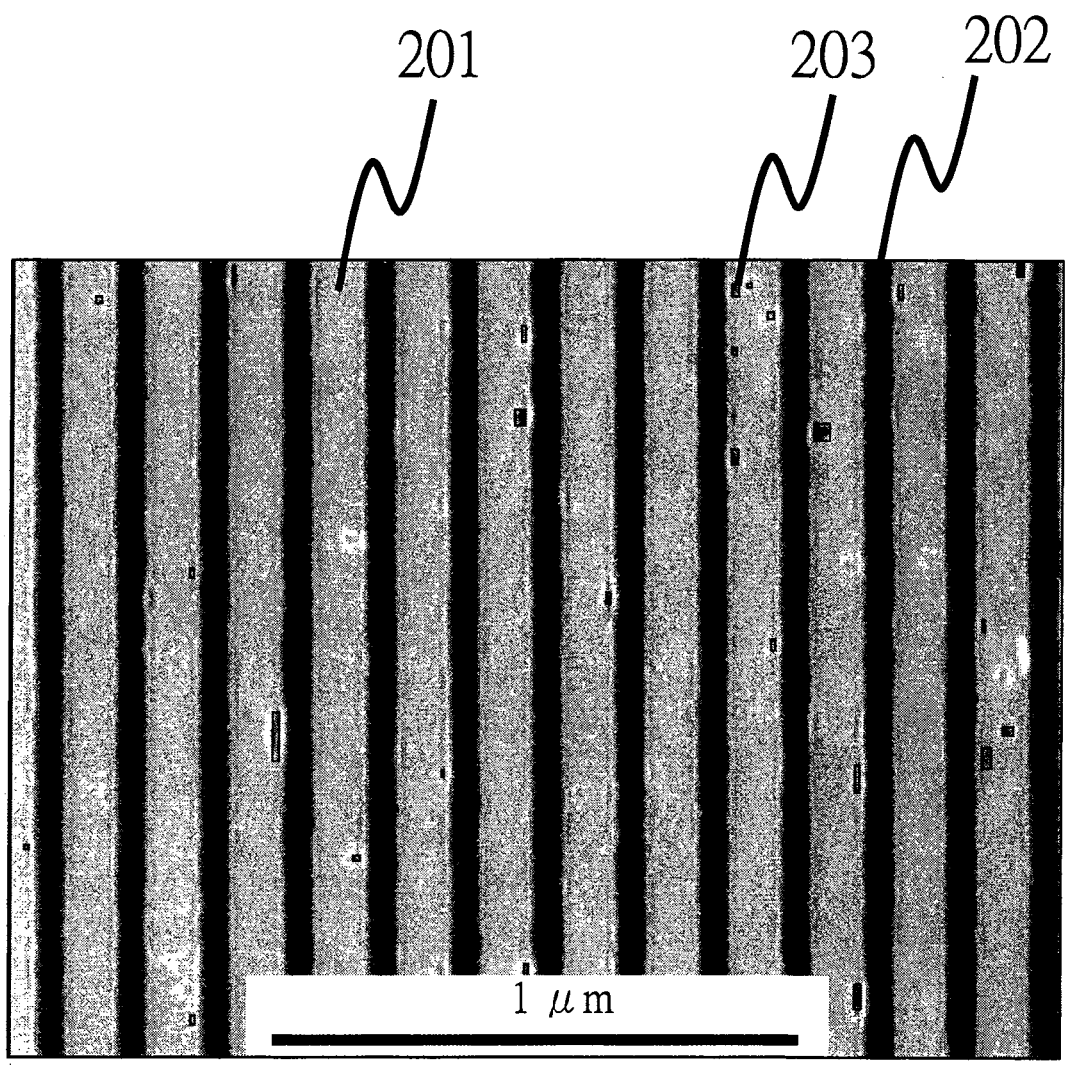
FIG. 2 is a diagram showing one example of a SEM review result of a Cu wiring formed on a semiconductor wafer according to an embodiment of the present invention.
Figure 3:
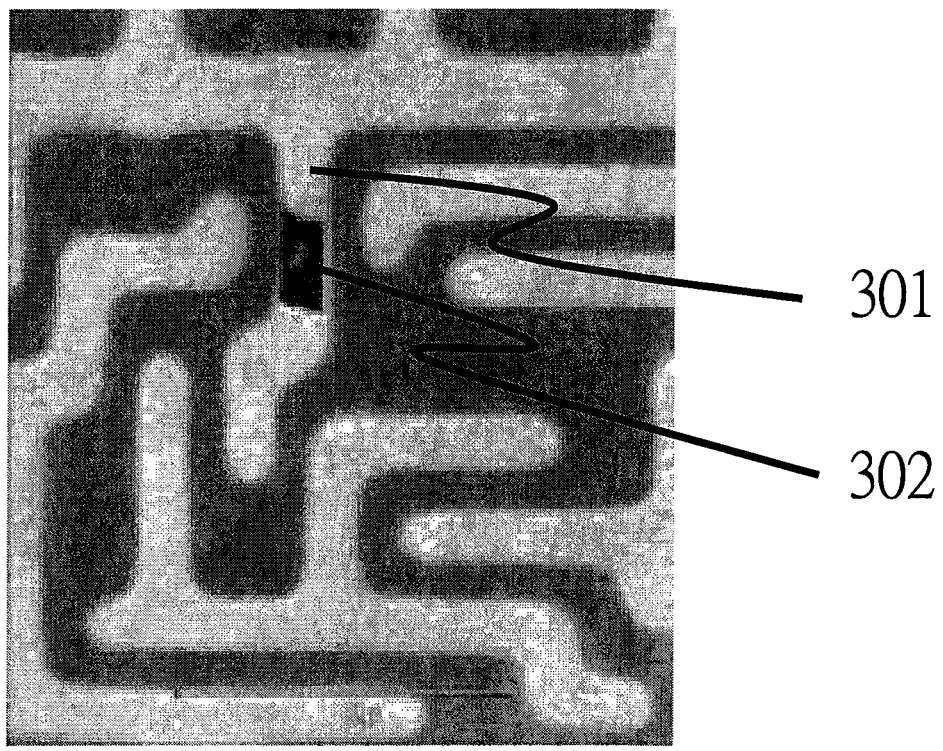
FIG. 3 is a diagram showing one example of a SEM review result showing partial wiring disconnection of a Cu wiring formed on a semiconductor wafer according to an embodiment of the present invention.

The first discovery is that surface voids of the Cu wiring are posed by formation of micro voids mainly formed at crystal grain boundaries of the Cu wiring and observable at the transmission electron microscope level. FIG. 1 shows an example where a surface void state of a semiconductor silicon (Si) wafer having Cu wirings formed by damascene process after CMP was examined by optical appearance inspection, where existence of surface voids 102 on a wafer 101 was recognized. The optical appearance inspection aims for knowing a density of surface voids or the like in a short time, but since it cannot identify positions of voids and forms of voids at respective, sites on the wirings, void review utilizing the scanning electron microscope (SEM) was performed in the case of examining a specific void state at the relatively micro level. FIG. 2 shows an example of a SEM review result. A Cu wiring 201 and an insulating layer 202 can be discriminated from each other and such a fact that a surface void 203 is formed within the Cu wiring 201 can be determined. When the surface void is formed so as to extend through a wiring width, it leads to a critical void to damage functions of LSI. FIG. 3 shows a SEM review result showing an example of a critical void, where a wiring disconnection of a Cu wiring 301 occurs due to formation of a critical void 302. A possibility that a surface void having a small size which did not configure a critical void in a conventional wiring gets to configure a critical void along with scaling of wiring increases, so that investigation of formation cause of a surface void and development of a technique for essentially suppressing the surface void are important problems in manufacture.

Figure 4:
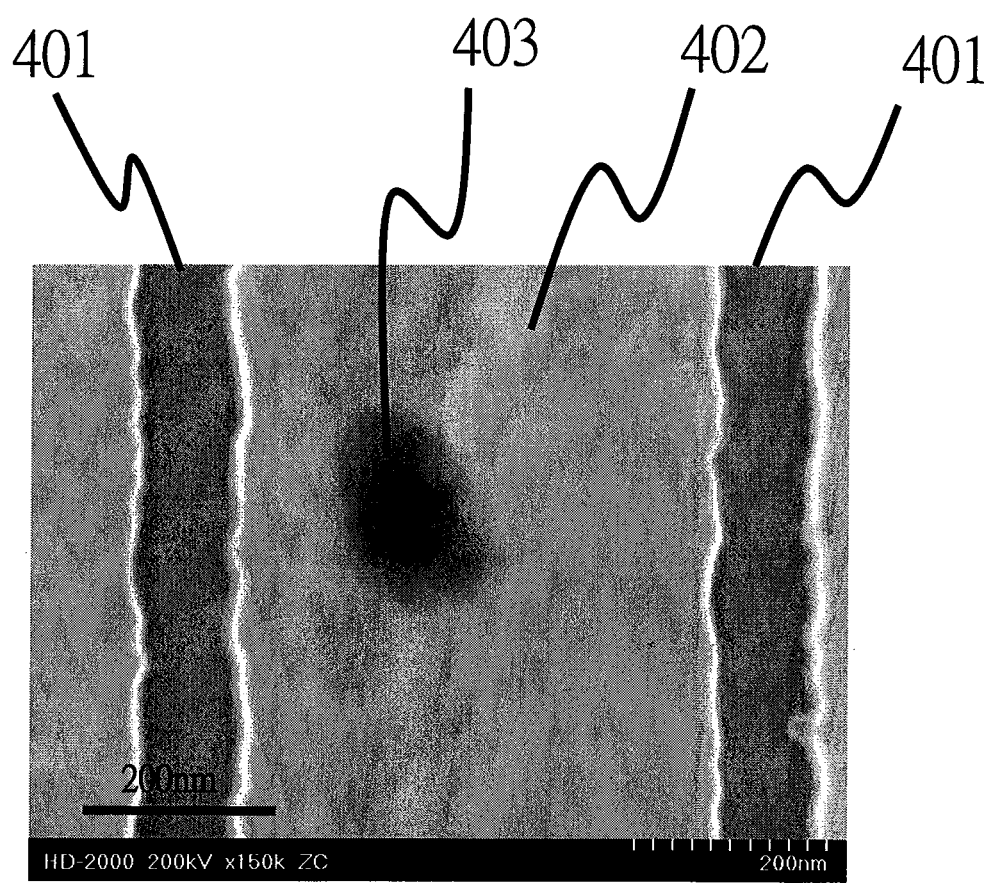
FIG. 4 is a diagram showing a STEM observation result (before CMP processing) of an image of a void formed in a Cu wiring formed on a semiconductor wafer according to an embodiment of the present invention.

In the present invention, research of micro voids on a wiring using a scanning transmission electron microscope (STEM) and a transmission electron microscope (TEM) was performed in order to find the formation cause of a surface void. FIG. 4 shows an example of a STEM observation result of a sample where, in a state that a Cu wiring has been electroplated, a surface portion of the wiring before CMP was removed by focused ion beam (FIB) process. The observation mode is a STEM dark field image where a Cu layer 402 made into a wiring is present between insulating layers 401 and formation of a relatively large void 403 shown by black contrast can be confirmed in the Cu layer 402. From this, it has been found that such a case may occur that a void is formed in a Cu wiring before a CMP polishing process is performed. Simultaneously therewith, FIG. 5 shows a TEM-observed result of a cross section of a plated layer obtained by increasing an amount of impurity taken in a Cu-plated layer by making a rotating speed of the wafer higher than a normal value upon Cu-electroplating and annealing the same for crystallization at a temperature of 400° C. It has been found that micro voids 503 having large and small sizes were formed within a Cu-plated layer 501 from a Cu-plated layer surface 502 inwardly. It has been also found that many micro voids are formed along grain boundaries 504 (traced by dotted lines on the TEM image) of the Cu-plated layer regardless of size of voids.

According to these results, a surface void generation mechanism subsequent to CMP is clarified and schematically illustrated in FIGS. 6A to 6C. That is, FIGS. 6A to 6C are schematic diagrams showing a surface void generation elementary process of a Cu wiring in Cu wiring section. As shown in FIG. 6A, an atomic vacancy (hereinafter, called "vacancy") 603 is present at a crystal lattice point in a Cu-plated layer 601 in addition to at a grain boundary 602 in Cu plating. When the Cu-plated layer is annealed for crystallization, vacancies exhibit diffusive movements and they get together at a grain boundary and inside a grain so that a micro void 604 is formed, as shown in FIG. 6B. Especially, formation and growth of a micro void take place dominantly at a grain boundary, so that a size of the micro void also becomes large. In the Cu plating subsequent to CMP shown in FIG. 6C, the grown micro void is further coarsened due to chemical and mechanical actions of the CMP to form a surface void 605 or a surface void 606 due to desorption of crystal grains from a grain boundary where many micro voids have been formed, and these surface voids having sizes can be confirmed even by an optical appearance inspection. An evidential SEM image of the surface void generation mechanism described here is shown in FIG. 7. In the SEM imaging step shown in FIG. 7, it is observed a Cu wiring surface by SEM after subjecting the surface to an argon (Ar) ion milling after electroplating the Cu wiring without subjecting to a CMP step. A grain boundary 702 selectively formed by the Ar milling is observed on a Cu wiring surface 701, but it is found that a void 703 circled in FIG. 7 is formed on the grain boundary 702. Accordingly, it is conceivable that the surface void generation mechanism shown in FIG. 6 is appropriate where a surface void is generated originating the void 703 subsequent to CMP.

An evidence that vacancies introduced into the Cu-plated layer form a micro void in the Cu-plated layer after annealing for crystallization was established from the observation result of the micro void utilizing crystallization annealing temperature as a parameter. FIGS. 8A, 8B, and 8C show results of TEM-observed void formation behaviors of a cross section of a plated layer obtained when annealing is performed for two minutes for each temperature with changing annealing temperature of the Cu-plated layer in three steps to 250° C., 300° C., and 400° C. The annealing temperatures corresponding to FIGS. 8A, 8B, and 8C are 250° C., 300° C., and 400° C., respectively. The TEM observation is not the result obtained by evaluating micro voids on a whole portion of a semiconductor wafer, but a representative tendency can be obtained from the result. FIG. 9 shows a result obtained by evaluating formation behaviors of micro voids (abbreviated as "void" in FIG. 9) from these TEM photographs quantitatively. In FIG. 9, an average void diameter, an average void density, and an average void volume fraction are obtained and plotted with respect to a crystallization annealing temperature. The voids are not formed at all at the crystallization annealing temperature of 250° C., where the average void diameter and the average void volume fraction are zero, but such a tendency appears that the average void diameter increases but the average void density decreases along with increasing the annealing temperature to 300° C., and to 400° C. It has been also found out that the average void volume fraction has a peak value near a temperature of about 300° C.

On the other hand, as shown in Yoshida, "Behavior of Secondary Void mainly based on Electronic Microscope Observation: Sequel of Mechanical Properties of lattice Defect and Metal", The Japan Institute of Metals, 1966, generally, a void diameter increases and a void density decreases according to rising of temperature in a material having an elementary step where vacancies diffuse and get together so that voids are formed. The volume fraction of void shows a peak at a specific temperature as a result of conflicting temperature dependency between the diameter and the density. These behaviors can be explained by a theory regarding the void formation elementary process, as further described in the above document. That is, a temperature dependency of void formation behavior is determined due to a conflicting temperature dependency between a speed of vacancies getting together to a vacancy aggregate (void) being formed and a speed of vacancies to be separating from the aggregate. The former speed is determined depending on activation energy Em of movement of vacancies and the latter speed is determined depending on a value obtained by adding coupling energy between a vacancy aggregate and a vacancy to the Em. Both the speeds increase according to rising of temperature, but an increase amount of the latter speed is larger than that of the former speed. Therefore, a probability that a minute aggregate of vacancies once formed is broken up becomes high on a high temperature side, so that the number of vacancy aggregates which may grow is decreased. The result is reflected to behaviors of micro voids having sizes observable by TEM.

As a specific example, this theory has been established in void formation behaviors of Al or an Al alloy where excessive vacancies are introduced by rapid cooling, and the like and have been described in the abovementioned document by Yoshida. Therefore, micro voids in the Cu-plated layer in this research showing the temperature dependency of void formation coinciding with the abovementioned theory are concluded to be voids formed by diffusion and collection of vacancies introduced in plating which are caused due to annealing for crystallization. That is, it is considered that vacancy introduction in plating schematically illustrated in the surface void generation mechanism shown in FIG. 6 and the formation mechanism of micro voids due to anneal performed thereafter are theoretically appropriate. In the foregoing, the first discovery has been described in detail that the surface voids on the Cu wiring occur due to formation of micro voids formed at the crystal grain boundary of the Cu wiring and observable at the transmission electronic microscope level.

Second Discovery

Next, the second discovery will be described in detail. That is, a result of the study by the present inventors that micro void formation at a grain boundary in a Cu wiring has a correlation with grain boundary properties (called "grain boundary characteristics") will be shown in detail. In general, metal is a so-called polycrystalline body formed of an aggregate of crystal grains of single crystals, and grain boundaries which are interfaces of the aggregates. As described hereinbefore, the electroplated Cu wiring is also a polycrystalline body including grain boundaries. Since the grain boundary is an interface between a crystal grain and a crystal grain, its properties vary according to crystal orientations of the crystal grains. The grain boundary characteristics representing properties of a grain boundary can be mainly defined by a Sigma value ($\Sigma$ value) showing a coincidence degree of atomic arrangements present at crystal lattice points of crystal grains positioned on both sides of a grain boundary. A grain boundary having a low energy structure is generally called Coincidence Site Lattice Boundary (CSL), and a grain boundary having a Sigma value equal to or less than a threshold which is 27 or 29 is defined as CSL boundary, while a grain boundary having a structure of a relatively high grain boundary energy exceeding the threshold and a grain boundary which does not show coincidence and has a completely random high energy structure are collectively defined as random grain boundary. In this study, grain boundaries having a Sigma value=27 or less are regarded as CSL boundaries in order to define low-energy grain boundaries conservatively.

Since micro voids are preferentially formed at the grain boundary as described above, whether or not a correlation between a grain boundary Sigma value of an electroplated Cu wiring and a formation behavior of voids is present was examined in detail. FIG. 19 shows production conditions of Cu wiring samples prepared for examining void formation and grain boundary Sigma value. Respective samples were applied with wiring design including all wiring areas corresponding to allocations of a combination L/S of a wiring width L and a space between wirings S to the following seven stages. That is, Area 1: L/S=0.12 µm/1.08 µm, Area 2: L/S=0.12 µm/0.48 µm, Area 3: L/S=0.12 µm/0.22 µm, Area 4: L/S=0.12 µm/0.12 µm, Area 5: L/S=0.22 µm/0.12 µm, Area 6: L/S=0.48 µm/0.12 µm, and Area 7: L/S=100 µm/100 µm.

FIG. 10 shows a relationship between the void density and the CSL boundary frequency obtained from the samples shown in FIG. 19. The void density was measured from an image similar to that shown in FIG. 7 obtained by SEM observation on a Cu wiring surface after subjecting a surface of a sample to argon (Ar) ion milling slightly. The CSL boundary frequency was calculated by identifying Sigma values of the all grain boundaries and completely random grain boundaries by EBSP (electron backscattering diffraction pattern) measurement, and obtaining a ratio of occupation of a total length of grain boundaries whose Sigma values are 27 or less in lengths of all grain boundaries. From FIG. 10, it has been found that the void density has a correlation with the CSL boundary ratio, and the void density decreases as the CSL boundary frequency rises. That is, a new phenomenon that a whole void density is decreased by raising the CSL boundary frequency as a result of suppression of void formation in the CSL boundary has been found. A relationship between a frequency of a grain boundary having the Σ value 3 that is the lowest grain boundary energy (twin boundary, called "Σ3 grain boundary" hereinafter) and the CSL boundary frequency is shown in FIG. 11. Samples used regarding FIG. 11 are different in lot from those used regarding FIG. 10. It has been found that the CSL boundary frequency is substantially proportional to the Σ3 grain boundary frequency and the CSL boundary frequency increases along with the increase of the Σ3 grain boundary frequency.

On the other hand, a relationship between a Cu wiring manufacturing process condition and a Cu wiring grain boundary Σ value is found from FIG. 10. Samples #1 to #3 were annealed at a relatively high temperature, but such data has been obtained that impurity components contained in a Cu layer such as chlorine, sulfur, oxygen, and carbon become high when a wafer rotation speed in Cu layer formation is high, so that surface voids are increased like the Sample #1. Sample #2 and Samples subsequent thereto show a case where the wafer rotation speed was adjusted to be relatively low to lower the impurity concentration to ½.25 of that of the Sample #1. An impurity concentration ratio was evaluated from SIMS analysis. While the TEM observation result of the Cu-plated layer section of the Sample #1 has been already shown in FIG. 5, a TEM observation result of a Cu-plated layer section of the Sample #2 where the impurity concentration is low is shown in FIG. 12. Reference numeral 1201 denotes a surface position in a Cu-plated layer section. Reference numeral 1202 denotes a white dotted line tracing grain boundaries in a Cu-plated layer to make it easily recognized. It is apparent that sizes and number densities of micro voids 1203 are reduced due to lowering of the impurity content as compared with those shown in FIG. 5. Regarding a void density difference between the Sample #1 and #2 in FIG. 10, such tendency can be read that the void density relates to not only a difference in impurity amount but also rising of the CSL grain boundary frequency caused by reduction of the impurity amount that leads to a decrease of the void density. On the other hand, regarding the Samples #3 to #9, low impurity amounts are adapted similarly to the Sample #2, and other Cu layer formation conditions are changed.

The next point lies in the annealing temperature, and the Samples #1 to #3 adopt an annealing temperature of 400° C., while Samples #4 to #9 adopt an annealing temperature of 250° C. to 300° C., where such a tendency is apparent that the CSL boundary frequency increases and the void density decreases due to lowering of the annealing temperature to 250° C. to 300° C. However, even if the annealing temperatures are in the same temperature range from 250° C. to 300° C., the CSL boundary frequencies are not determined uniquely. For example, when exemplifying a surface void density of a product which does not damage semiconductor functions in a current wiring of 90 nm node obtained by optical appearance inspection, the void density after Ar ion milling is $1\times10^6$ pieces/cm$^2$ corresponding to ⅒ of the surface void density. It is understood from FIG. 10 that the CSL boundary frequency for obtaining the void density equal to or less than $1\times10^6$ pieces/cm$^2$ must be set to 60% or higher. However, even in the same annealing temperature range from 250° C. to 300° C., all the grain boundaries of the Cu wiring cannot fall within the CSL boundary frequency range of 60% or higher as shown in FIG. 10, and thus it is considered that other parameters than the annealing temperature governing the grain boundary characteristics are present.

That is, as shown in FIG. 10, since there is such a case that, if the seed layer is formed of pure Cu, the CSL boundary frequency cannot be set to 60% or higher even at the annealing temperature of 250° C. to 300° C. (Sample #4), the seed layer is necessary to be formed of Cu—Al alloy. When the seed layer is formed of Cu—Al alloy, it is possible to maintain the CSL boundary frequency in a high frequency of 60% or higher even when a low-molecular-weight organic polymer is adopted as additive for a plating solution to be used (Sample #6 and Samples subsequent thereto), or even when a ruthenium (Ru) barrier layer (Samples #8 and #9) is used. Thus, it has been found, regarding the CSL boundary frequency of the Cu wiring, that even if a singular plating parameter is defined, the Cu wiring having a high CSL boundary frequency cannot be provided uniquely, but the CSL boundary frequency of 60% or higher can be achieved by combining a plurality of plating parameters carefully to define them. Especially, a combination of Cu—Al alloying of the seed layer and setting of the crystallization annealing temperature to a temperature range from 250° C. to 300° C. is required to achieve the CSL boundary with a high ratio. Note that, it has been found that, in the case where a Ru barrier layer is adopted, when the crystallization annealing temperature is in a temperature range from 250° C. to 300° C., the CSL boundary frequency of 60% or higher can be achieved even if the seed layer is not adopted and Cu is plated directly to the Ru layer (Sample #9).

Influences of respective parameters on CSL boundary formation will be considered below. A plated layer is formed so as to fill in a wiring trench and cover an upper portion of the trench before CMP (overlay portion). When an annealing temperature of 250° C. to 300° C. is adopted and the Cu—Al alloy seed layer is used for crystallization of the Cu wiring, the CSL boundary frequency of 60% or higher can be achieved. Therefore, it is considered that core production/growth due to crystallization from the seed layer within the wiring trench is rate-controlled. Next, an elementary process from just after plating to crystallization is necessary to be considered. When an EBSP measurement is performed just after plating, crystallization cannot be observed. Therefore, it is conceivable that ultrafine crystals or amorphous materials with a high dislocation density having sizes smaller than a spatial resolution of EBSP have been formed. In a crystallization process of the Cu wiring caused by annealing subsequent thereto, it is conceivable that the so-called recovery/recrystallization phenomenon (rotation, coalescence, and growth of crystals accompanying recovery/extinction of dislocation and grain boundary movement) takes place. Driving force of recovery/recrystallization is generally obtained from high strain energy in metal.

Accordingly, in the crystallization process, it is conceivable that the grain boundary is configured from tangling of dislocation and sub-grain boundary generation, rotation and growth of crystals surrounded by the sub-grain boundaries subsequent thereto, grain boundary formation posed by extinction of tangled dislocation in the sub-grain boundaries, and rotation and growth of crystals posed by grain boundary movement. In this process, since crystals are arranged so as to lower the strain energy of the plated layer to the minimum, the grain boundary which is an interface between crystals should be ideally recovered and recrystallized toward the CSL boundary having a low energy structure. However, it is conceivable that impurities in the plated layer especially serve to fix dislocations and to prevent movement of grain boundaries so that the CSL boundary frequency is lowered. Accordingly, it is preferable that the concentration of impurity in the plated layer is low. It is estimated regarding the additive in the plating solution that high-molecular-weight organic polymer serves like the impurity. Therefore, it is preferable that low-molecular-weight organic polymer is used as the additive.

While annealing is required for crystallization, there is a possibility that annealing at a high temperature causes a rapid growth before rotation of a crystal after core generation takes place sufficiently, and thus it is preferable to perform annealing at a low temperature of 250° C. to 300° C. to improve the CSL boundary ratio. However, as described above, since the annealing temperature influences diffusion movement of cavities and production/growth process of voids in a plated layer, it is preferable that the annealing temperature does not exceed 300° C. which is the peak temperature of the void volume fraction. Similarly, it is preferable in order to cause rotation of crystals sufficiently that a combination of low temperature heating+long time annealing+slow temperature falling is adopted as long as the other conditions are the same, but the combination is not essential since a sufficient CSL boundary frequency can be obtained even in a combination of rapid heating+short time annealing+rapid temperature falling like the abovementioned Samples #5 and #6.

It is preferable that a Cu seed layer containing Al is used as the seed layer. It is conceivable that this is because a plated Cu wiring causes core production/growth from the alloy seed layer so as to raise the CSL boundary ratio, but it is also conceivable that a very small amount of Al diffuses and moves from the seed layer into the Cu-plated layer in annealing time and void formation behavior is delayed by an action that blocks diffusion movement of cavities into the plated layer. Accordingly, it is an essential condition to use the Cu—Al alloy seed layer in order to set the CSL boundary frequency to 60% or higher. Here, a chemical composition of the Cu—Al alloy seed layer referred to in this invention is Cu containing Al added in an amount of 2.0 wt % or less, for example. A similar sufficient effect was obtained even in Al addition in an amount of 1.0 wt % or less. By adopting the Cu—Al alloy seed layer and setting the annealing temperature to 250° C. to 300° C., the CSL boundary frequency can be set to 60% or higher (Sample #8), even when a barrier layer of a base other than tantalum (Ta) base (Ta or tantalum nitride (TaN)), namely, a layer of ruthenium (Ru) base is used. However, when the Ru barrier layer is used, even when the seed layer is not formed, the CSL boundary frequency can be set to 60% or higher (Sample #9).

From the result (FIG. 10) of examination of a relationship between the void density and the CSL boundary frequency on a wiring surface using Samples #7 and #8 shown in FIG. 19, a significant difference due to a difference in barrier layers is observed in the relationship between the void density and the CSL boundary ratio. That is, in comparison between a case where a barrier layer of Ta-base is used and a case where a barrier layer of Ru-base is used, the same void density can be achieved with a relatively low CSL boundary frequency in the former case. It is conceivable that this is caused by a difference in crystalline properties between the respective barrier layers, and the ground thereof will be described below.

FIG. 13 shows results regarding Samples #7 and #8 shown in FIG. 19 obtained by identifying a crystal structure of a barrier layer formed on an insulating layer by sputtering, a crystal structure of a seed layer formed on the barrier layer by sputtering, and a crystal structure of a Cu wiring finally formed on the seed layer by electroplating using X-ray diffraction method. A crystal orientation of the barrier layer was identified by highly-sensitive in-plane X-ray diffraction method and crystal orientations of the seed layer and the Cu wiring were quantitatively obtained from a peak area ratio based on a wide-angle X-ray diffraction method. Such a result has been obtained that (002) orientation of hexagonal crystal is observed regarding the Ru-base barrier layer, (111) orientation of the Cu—Al alloy seed layer is 91%, and the orientation of the final Cu-plated layer includes (111) of 44% and (200) of 54%. On the other hand, when the Ta-base barrier layer is used, (330) and (331) orientations of tetragonal crystal is significant in the barrier layer, and the Cu—Al alloy seed layer formed thereon shows (111) orientation of 96%, so that the Cu-plated layer includes orientations of (111) of 93% and (200) of 1%. As the result from these, the CSL boundary frequency of the Cu-plated layer is in a range from 61 to 72% when the Ru-base barrier layer is used, and the CSL boundary frequency is in a range from 63 to 78% when the Ta-base barrier layer is used, and thus the CSL boundary frequency corresponding to FIG. 10 for example where the surface void density of $0.5 \times 10^6$ pieces/cm$^2$ can be achieved is about 75% in the Ru-base barrier layer and it is about 65% in the Ta-base barrier layer. Therefore, it has been found that usage of the Ta-base barrier layer can reach a low void density with a lower CSL boundary ratio.

The abovementioned results have been substantially similar whichever in a case where the Ta-base barrier layer is a single layer (Ta) of tantalum (Ta) crystals or a composite layer (Ta/TaN) of Ta crystals and tantalum nitride (TaN) crystals or in a case where the Ru-base barrier layer is a single layer (Ru) of ruthenium (Ru) crystals or a composite layer (Ru/RuN) of Ru crystals and ruthenium nitride (RuN) crystals. Further, while these results indicate that the grain boundary characteristics of the final Cu wiring crystals is affected by the crystal properties of the seed layer positioned under the same and the crystal properties of the barrier layer positioned under the seed layer, since the CSL boundary frequency of the Cu wiring achieved a high frequency of 60% or higher even when any of the Ru-base barrier layer and the Ta-base barrier layer is used, one of the Ru-base barrier layer and the Ta-base barrier layer can be selectively used according to a usage condition of the Cu wiring or a condition of the wiring width. Moreover, even when the Ru-base barrier layer is stacked on the Ta-base barrier layer (a composite layer (Ta/Ru) of Ta crystals and Ru crystals, or a composite layer (Ta/TaN/Ru) of Ta crystals, TaN crystals, and Ru crystals), the CSL boundary frequency of the Cu wiring can achieve a high frequency of 60% or higher, so that the Ta-base barrier layer and the Ru-base barrier layer can be used simultaneously. On the other hand, such an effect have been confirmed that, when EBSP measurement of a Cu wiring is performed using a titanium (Ti) base barrier layer (a single layer of Ti crystals, a single layer of titanium nitride (TiN) crystals, or a composite layer of Ti crystals and TiN crystals) instead of the Ru-base barrier layer and the Ta-base barrier layer, the CSL boundary frequency of the Cu wiring achieves a high frequency of 60% or higher like the Ru-base barrier layer and the Ta-base barrier layer.

Third Discovery

Finally, the third discovery will be described. That is, the result where surface voids were reduced down to a level lower than the practical level according to grain boundary characteristics control will be described in detail. First, the result obtained by examining a correlation between a surface void density (a normalized value) of a wafer obtained by optical appearance inspection and a surface void density (a surface void density evaluated by means similar to that shown in FIG. 7, corresponding to a void density of a vertical axis in FIG. 10) of a Cu wiring after Ar milling obtained by SEM observation is shown in FIG. 14. From FIG. 14, it has been found that a relationship of $Y=8731.5 \, X^{0.6397}$ is present between a surface void density after Ar milling Y and a surface void density by optical appearance inspection X. A wafer where the void density is $1.0 \times 10^6$ pieces/cm² or less shown in FIG. 10 reaches a sufficiently sound surface void density in optical appearance inspection of the wafer as a product, which corresponds to a void density state of a wafer where a void density is reduced down to 1/10 or less of a void density of LSI which can maintain normal functions.

Accordingly, it has been found that a Cu wiring where a void density can be reduced down to 1/10 or less of a void density of LSI which can maintain normal functions has a CSL boundary frequency of 60% (0.6) or higher, or a Σ3 grain boundary frequency of 40% (0.4) or higher from FIG. 11, and it has lead to the present invention. FIGS. 15A and 15B show examples of specific examination results of optical appearance inspection on a semiconductor wafer having a Cu wiring in a case where the CSL boundary frequency is 33 to 59% according to the conventional art in FIG. 15A, and a semiconductor wafer having a Cu wiring in a case where the CSL boundary frequency is 60 to 83% according to the present invention in FIG. 15B. The surface void is denoted by a reference numeral 1501 in FIGS. 15A and 15B. That is, it has been found that the Cu wiring of the present invention reached 1/1000 or less of a void density by optical appearance inspection, and thus a surface void density lower than the practical void density level of LSI by three digits or more can be achieved by controlling the grain boundary characteristics of the Cu wiring to have a CSL grain boundary frequency at 60% or more (Σ3 grain boundary at 40% or more) as compared with the Cu wiring in the conventional art.

Embodiments

The present invention provides a Cu wiring having a basic Cu crystal structure which can reduce Cu wiring surface voids to 1/10 or less of a void density of a conventional wafer according to the abovementioned three discoveries. By extracting proper combinations of materials for the barrier layer and seed layer upon manufacturing a Cu wiring and manufacturing conditions for the Cu wiring, the CSL boundary frequency or the Σ3 grain boundary frequency of the Cu wiring is increased, so that a Cu wiring provided with a basic crystal structure which can reduce surface voids to a level considerably lower than the practical level even when wiring scaling is advanced is achieved.

Basic data regarding the embodiments for carrying out the invention are similarly obtained in all wirings in not only a semiconductor device comprising a semiconductor substrate, an insulating layer provided on the semiconductor substrate, and a plurality of Cu wirings provided in the insulating layer in the same level via a composite layer comprising a barrier layer and a seed layer on the barrier layer and provided between the Cu wiring and the insulating layer, but also a semiconductor device having a multilayer structure where a plurality of, for example, two to nine, Cu wirings at the same level provided in the insulating layer via the composite layer are vertically stacked.

Various electronic parts for a memory system, an apparatus control system, or an information (data) transmitting and receiving system can be established using the semiconductor device of the present invention, so that a portable electronic apparatus such as a mobile phone and a notebook-type personal computer, and an apparatus for automobile such as an engine system, a brake system, and a car navigation system, incorporated with these electronic part system can be configured. Therefore, a mobile phone, a portable electronic apparatus, an apparatus for an automobile, and an automobile which include the semiconductor device of the present invention as a constituent part, and all social infrastructure systems constructed with using the semiconductor device of the present invention are products included in a product family relating to the present invention.

It is effective to provide a step of examining grain boundary characteristics of a Cu wiring in manufacture and inspection of the semiconductor device of the present invention described above for yield improvement and cost reduction in mass production of products, and the step of examining grain boundary characteristics of a Cu wiring can be performed by the electron backscattering diffraction pattern (EBSP) method as described in descriptions regarding FIGS. 10 and 11 as an example of the semiconductor manufacturing and inspecting apparatus. On the other hand, grain boundary characteristics can be measured from observation of a surface pattern obtained by a scanning electron microscope (SEM) utilizing an accelerating voltage of 5 V or less instead of the EBSP measurement. A principle of that will be described below.

FIGS. 16A and 16B show a comparison between a Cu wiring surface portion observed by SEM at an accelerating voltage of 5 kV or less (FIG. 16A) and the result measured by EBSP in the same field (FIG. 16B). A sample is obtained after an overlay portion of a Cu wiring is CMP-processed when the Cu wiring is formed on an insulating layer on a semiconductor substrate via a composite layer formed of a Ta/TaN barrier layer and a Cu seed layer by electroplating, and it was annealed at a temperature of 250° C. In the SEM observation and EBSP measurement, the observation/measurement were performed so as not to cause surface oxidation immediately after an extreme surface layer removed in a state that the extreme surface layer has been slightly removed from a surface of the Cu wiring layer by Ar ion sputtering in advance. The preparation to remove the extreme surface layer is essential for developing a surface pattern occurring due to generation of a difference in removal yield of the surface caused by an atom arrangement depending on the orientation of crystal, and any method which allows the removal of the surface in a range from several atom layers to several tens of nm according to a removal yield depending on a crystal orientation can be adopted in addition to the ion sputtering. A removal utilizing, for example, glow discharge method can be used.

Since it is necessary to determine a orientation of crystal grains positioned on both sides of a grain boundary in order to identify grain boundary characteristics based on the EBSP measurement, crystals having respective orientations of (111), (001), (511), and (221) which are representative crystal orientations of the Cu layer oriented on a surface being shifted within a range of 10° were extracted as the EBSP measurement result. From the SEM observation result shown in FIGS. 16A and 16B, it has been newly found that various patterns appear in the respective crystal grains depending on their orientations, and the orientations of the respective crystal grains have been determined from comparison with the EBSP measurement result. Since it becomes difficult to capture the SEM observation pattern at an accelerating voltage exceeding 5 kV, the capturing was performed at a voltage of 5 kV or less. A similar pattern have been captured at an electron beam accelerating voltage of 5 kV or less also by an accelerating voltage biasing system provided within a pole piece.

FIGS. 17A and 17B show the result of comparison using the abovementioned sample between a grain boundary characteristics of a crystal grain boundary identified from SEM observation pattern at an accelerating voltage of 5 kV or less in a different field (FIG. 17A) and grain boundary characteristics identified in the same field as the SEM image based on EBSP measurement (FIG. 17B). In an image analysis performed based on a photographed SEM observation image, geometrical patterns and changing points of contrast were extracted and to recognize crystal grains. Subsequently, crystal orientations were identified from surface patterns and contrasts of the respective crystal grains. Then, grain boundary characteristics were classified to CSL boundaries and random grain boundaries from relationships of orientations of the respective crystal grains. FIG. 17A showing the result, thus obtained, where grain boundary characteristics have been identified from SEM image patterns at an accelerating voltage of 5 kV or less shows good coincidence with FIG. 17B showing grain boundary characteristics identified from EBSP measurement, where identification of grain boundaries up to detailed portions thereof was achieved with a resolution higher than that of the EBSP measurement.

When a scanning ion microscope (IM) is used, an observation image of an extreme surface layer based on crystal orientations or a shape was obtained owing to use of ion beams, so that crystal grains, crystal orientations, and grain boundary characteristics of Cu were recognized according to similar analysis. Since ion is heavier in mass than electron, a penetration depth of ion from the surface is extremely shallow and diffusion of ions is small, so that any ion beam can be used, where ion beam easily used in an electron microscope, FIB and the like, for example, helium, lithium, gallium, and the like can be used.

The EBSP method, the SEM observation at an accelerating voltage of 5 kV or less, and the ion microscope observation method can review not only a fine Cu wiring portion but also the whole of a wafer briefly, and they are especially preferable means in the inspection field for semiconductor devices.

On the other hand, when the atomic force microscope (AFM) is used, its observation field is narrow, but it can accurately observe a geometrical pattern based on a shape of a surface as undulation information and can recognize crystal orientations of Cu easily so that grain boundary characteristics of even a Cu wiring with a wiring width of 50 nm or less were recognized.

Further, to perform mapping of crystal orientations from a diffraction pattern analysis or a dark field image using a transmission electron microscope (TEM), a step such as a cross-section processing of a sample is required, but more detailed analysis of the crystal grains, crystal orientations, and grain boundary characteristics of Cu were made even on finer wiring and a fine crystal grain as compared with the EBSP measurement or the like.

Since the AFM method or TEM method is narrow in field to be observed, it is suitable for local analysis rather than review of a whole surface of a wafer, where the method was suitable for evaluation of a fine Cu wiring of a semiconductor device and the like.

The way of recognizing crystal grains, crystal orientations, and grain boundary characteristics of Cu from an SEM image pattern at an accelerating voltage of 5 kV or less is widely applicable and not limited to the semiconductor device, but it is preferable especially in the field of semiconductor devices since it is desired to analyze a fine portion with a high performance.

Accordingly, among manufacturing and inspecting apparatuses of a semiconductor device, a semiconductor manufacturing and inspecting apparatus having a feature of implementing a step of examining grain boundary characteristics of a Cu wiring configuring a semiconductor device by EBSP measurement or a scanning electron microscope at an accelerating voltage of 5 kV or less, and further implementing the step by a scanning ion microscope, a transmission electron microscope, an atomic force microscope, and the like is related to the present invention.

The specific embodiments of the present invention have been described above, and examples according to the present invention will be described below.

Example 1

A method of manufacturing a CMOS (Complementary Metal Oxide Semiconductor) device which is one example (Example 1) of a semiconductor device according to the present example of the present invention will be described with reference to FIG. 18. FIG. 18 is a cross-sectional view of a CMOS device, which is an LSI of 65 nm node. The LSI has Cu wirings at the same level provided with a multilayer structure formed by vertically stacking six layers.

As shown in FIG. 18, a semiconductor substrate 1 formed of, for example, a p-type single crystal (a substantially circular thin plate of semiconductor in plan view, called "semiconductor wafer") is prepared. Next, a device isolation region 4 is formed on a main surface of the semiconductor substrate 1. A p-type well 6 is formed by implanting a p-type impurity, for example, boron, in an NMIS formation region of the semiconductor substrate 1, and an n-type well 8 is formed by implanting an n-type impurity, for example, phosphorus, into a pMIS formation region of the semiconductor substrate 1. Then, after a surface of the semiconductor substrate 1 is cleaned by wet-etching using, for example, fluorinated acid aqueous solution, the semiconductor substrate 1 is thermally oxidized to form a gate insulating layer 9 with a thickness of, for example, 5 nm on a surface of the semiconductor substrate 1.

Next, after a conductive layer for gate electrode with a thickness of, for example, 0.14 μm is formed on the gate insulating layer 9, the conductive layer for gate electrode is processed by dry-etching using a resist pattern layer as a mask to form gate electrodes 10n and 10p formed of the conductive layer. By ion-implanting an n-type impurity, for example, arsenic into the p-type well 6, a source-drain extension region 11 with a low concentration is formed with respect to the gate electrode 10n for NMIS. Similarly, by ion-implanting a p-type impurity, for example, boron fluoride into the n-type well 8, a source-drain extension region 12 with a low concentration is formed with respect to the gate electrode 10p for PMIS.

Next, after a silicon oxide layer 13 having a thickness of, for example, 10 nm is deposited on the main surface of the semiconductor substrate 1 by CVD method, a silicon nitride layer is further deposited on the silicon oxide layer 13 by CVD method. Subsequently, by etching the silicon nitride layer in an anisotropic manner, sidewalls 15 are formed on side surfaces of the gate electrode 10n for nMIS and the gate electrode 10p for pMIS, respectively. Thereafter, by ion-implanting an n-type impurity, for example, arsenic into the p-type well 6, source-drain extension regions 16 with a low concentration are formed with respect to the gate electrode 10*n* for NMIS and the sidewalls 15. Similarly, by ion-implanting a p-type impurity, for example, boron fluoride into the n-type well 8, source-drain extension regions 17 with a low concentration are formed with respect to the gate electrode 10*p* for pMIS and the sidewalls 15.

Next, for example, low-resistance nickel silicide layers 18 are formed on surfaces of the gate electrode 10*n* for nMIS and the source-drain extension regions 16, and surfaces of the gate electrode 10*p* for pMIS and the source-drain extension regions 17.

Next, a silicon nitride layer is deposited on the main surface of the semiconductor substrate 1 by CVD method to form a first insulating layer 19*a*. Subsequently, a Tetra Ethyl Ortho Silicate (TEOS) layer is deposited on the first insulating layer 19*a* by CVD method to form a second insulating layer 19*b*, and a surface of the second insulating layer 19*b* is polished by CMP method so as to obtain a planarized interlayer insulating layer.

Next, the first insulating layer 19*a* and the second insulating layer 19*b* are etched with using a resist pattern as a mask to form connection holes 20. A diameter of the connection hole 20 is 0.1 μm or less. A titanium layer and a titanium nitride layer are sequentially formed on the main surface of the semiconductor substrate 1 including insides of the connection holes 20 to form barrier metal layers 21 formed of the stacked layer of the titanium layer and titanium nitride layer.

Next, a tungsten layer 22 is deposited on the main surface of the semiconductor substrate 1 including insides of the connection holes 20 by CVD method. By planarizing a surface of the tungsten layer 22 by CMP method, the tungsten layer 22 is embedded into the connection holes 20 so that plugs including the tungsten layer 22 as its main conductive material are formed.

Next, a stopper insulating layer 24 and an insulating layer 25 for wiring formation are sequentially formed on the main surface of the semiconductor substrate 1. The stopper insulating layer 24 is a layer serving as an etching stopper in a trenching process to the insulating layer 25. The stopper insulating layer 24 may be a silicon nitride layer formed by, for example, CVD method, while the insulating layer 25 may be a silicon oxide layer formed by, for example, CVD method.

Next, a first layer of wiring is formed by single damascene process. After wiring trenches 26 are formed at predetermined regions of the stopper insulating layer 24 and the insulating layer 25 by dry-etching using a resist pattern as a mask, a barrier metal layer 27 is formed on the main surface of the semiconductor substrate 1. The barrier metal layer 27 is, for example, a titanium nitride layer, a tantalum nitride layer, a stacked layer obtained by stacking a tantalum layer on a tantalum nitride layer, or a stacked layer obtained by stacking a ruthenium layer on a tantalum nitride layer. Subsequently, a seed layer of copper is formed on the barrier metal layer 27 by CVD method or sputtering method, and a copper-plating layer is further formed on the seed layer using electrolytic plating method. The copper plating can be formed by one-time processing, but it can be similarly formed by a process including at least two plating steps. The copper plating is filled in the wiring trenches 26. Subsequently, the copper plated layer is re-crystallized by annealing, and the copper plated layer, the seed layer, and the barrier metal layer 27 positioned on regions other than the wiring trenches 26 are removed by CMP, so that a first layer of wiring M1 including the copper layer as its main conductive material is formed.

Next, a second layer of wiring is formed by dual damascene process. A cap insulating layer 28, an interlayer insulating layer 29, and a stopper insulating layer 30 for wiring formation are sequentially formed on the main surface of the semiconductor substrate 1. The cap insulating layer 28 is a silicon nitride layer formed by CVD method, for example, and it can function as a protective layer preventing diffusion of copper configuring the first layer of wiring M1. The interlayer insulating layer 29 may be a TEOS layer formed by CVD method, for example. The stopper insulating layer 30 may be a silicon nitride layer formed by CVD method, for example.

Next, an insulating layer 31 for wiring formation is formed on the stopper insulating layer 30 after the stopper insulating layer 30 is processed by dry-etching using a resist pattern for hole formation as a mask. The insulating layer may be a TEOS layer, for example.

Next, the insulating layer 31 is processed by dry-etching using a resist pattern for wiring trench formation as a mask. Subsequently, the interlayer insulating layer 29 is processed by dry-etching with using the stopper insulating layer 30 and the resist pattern for wiring trench formation as masks. At this time, the cap insulating layer 28 functions as an etching stopper. Subsequently, by removing the exposed cap insulating layer 28 by dry-etching, connection holes 32 are formed in the cap insulating layer 28 and the interlayer insulating layer 29, and wiring trenches 33 are formed in the stopper insulating layer 30 and the insulating layer 31.

Next, a second layer of wiring is formed inside the connection holes 32 and the wiring trenches 33. The second layer of wiring is formed of a barrier metal layer and a copper layer that is a main conductive material. A part connecting this wiring and the first layer of wiring M1 which is a lower layer wiring is formed integrally with the second layer of wiring. A barrier metal layer 34 is formed on the main surface of the semiconductor substrate 1 including insides of the connection holes 32 and the wiring trenches 33. The barrier metal layer 34 is, for example, a titanium nitride layer, a tantalum nitride layer, a stacked layer obtained by stacking a tantalum layer on a tantalum nitride layer, or a stacked layer obtained by stacking a ruthenium layer on a tantalum nitride layer. Subsequently, a seed layer of copper is formed on the barrier metal layer 34 by CVD method or sputtering method, and a copper-plating layer is further formed on the seed layer using electrolytic plating method. The copper plating can be formed by one-time processing, but it can be similarly formed by a process including at least two plating steps. The copper plating layer is embedded in the wiring trenches 33. Subsequently, the copper-plating layer is re-crystallized by annealing, and the copper-plating layer, the seed layer, and the barrier metal layer 34 positioned on regions other than the wiring trenches 33 are removed by CMP, so that a second layer of wiring M2 including copper layer as its main conductive material is formed.

Thereafter, a third layer of wiring M3, a fourth layer of wiring M4, a fifth layer of wiring M5, and a sixth layer of wiring M6 which are upper layers are sequentially formed in a similar manner with that of the second layer of wiring M2. A silicon nitride layer 35 is formed on the sixth layer of wiring M6, and a silicon oxide layer 36 is formed on the silicon nitride layer 35. The silicon nitride layer 35 and the silicon oxide layer 36 function as passivation layers preventing invasion of water or impurity from the outside.

Next, a portion of the sixth layer of wiring M6 is exposed by etching the silicon nitride layer 35 and the silicon oxide layer 36 using a resist pattern as a mask. Subsequently, by forming a base bump electrode 37 formed of a stacked layer of a metal, a nickel layer and the like on the exposed sixth layer of wiring M6 and forming a bump electrode 38 formed of gold, solder or the like on the bump ground electrode 37, thereby completing a CMOS device of the present example.

The bump electrode 38 serves as an electrode for external connection. Thereafter, the semiconductor substrate (semiconductor wafer) is cut to individual semiconductor chips and each chip is mounted on a package board or the like to be completed.

In order to confirm an effect of the present example, samples (1a, 1b, 1c, and 1d) corresponding to four conditions total where the barrier metal layer (=the barrier layer) of a Cu wiring was a stacked layer (Ta/TaN) obtained by stacking a tantalum layer on a tantalum nitride layer, the seed layer was one of a Cu—Al seed layer and a pure Cu seed layer (two conditions), the annealing temperature after forming a copper plate layer was one of 275° C. and 400° C. (two conditions) were fabricated using the CMOS device shown in FIG. 18.

The sample 1a was prepared under such a condition that the seed layer was a Cu—Al seed layer and a copper-plating layer annealing temperature was 275° C., the sample 1b was prepared under such a condition that the seed layer was a Cu—Al seed layer and the copper-plating layer annealing temperature was 400° C., the sample 1c was prepared under a condition that the seed layer was a pure Cu seed layer and the copper-plating layer anneal layer was 275° C., and the sample 1d was prepared under a condition that the seed layer was a pure Cu seed layer and the copper-plating layer annealing temperature was 400° C., where, when forming from the first layer of wiring M1 to the second layer of wiring M2, the third layer of wiring M3, the fourth layer of wiring M4, the fifth layer of wiring M5, and the sixth layer of wiring M6 which were upper layers shown in FIG. 18, processings were done under the same conditions as described above so that each device was completed. Note that, the sample 1a satisfies the conditions where the CSL boundary frequency of the Cu wiring of 60% or more can be achieved. Inspections of the samples 1a, 1b, 1c, and 1d were performed, where the confirmed yields of the samples 1a, 1b, 1c, and 1d were 72%, 65%, 67%, and 63%, respectively. From this experiment, the yield improvement of the sample 1a under the condition capable of achieving the CSL boundary frequency of the Cu wiring of 60% or more was confirmed. It is conceivable that the reason of yield improvement is non-conduction of the wiring caused by the Cu void is reduced as mentioned above.

Example 2

In Example 2, an LSI of 45 nm node was manufactured in the semiconductor device (CMOS device) described in Example 1. The manufacturing process and the conditions of samples 2a, 2b, 2c, and 2d of the present example are the same as the samples 1a, 1b, 1c, and 1d of Example 1.

In the present example, the sample 2a satisfies the condition where the CSL grain boundary frequency of the Cu wiring of the present invention can achieve 60% or more. Inspections of the samples 2a, 2b, 2c, and 2d were performed, where the confirmed yields of the samples 2a, 2b, 2c, and 2d were 59%, 52%, 54%, and 50%, respectively. From this experiment, the yield improvement of the sample 2a under the condition capable of achieving the CSL grain boundary frequency of the Cu wiring of 60% or more was confirmed. It is conceivable that the reason of yield improvement is non-conduction of the wiring caused by the Cu void is reduced as mentioned above.

In the foregoing, the invention made by the inventors of the present invention has been concretely described based on the embodiments and examples. However, it is needless to say that the present invention is not limited to the foregoing embodiments and examples and various modifications and alterations can be made within the scope of the present invention.

For example, while the semiconductor device (CMOS device) has been explained as an example in the embodiments and examples, the present invention is not limited to the semiconductor device (CMOS device) and it can be widely applied to other devices having at least one layer of Cu wiring provided in an insulating layer provided on a semiconductor substrate via an composite layer formed of a barrier layer and a seed layer on the barrier layer and provided between the Cu wiring and the insulating layer.

Further, the present invention is not limited to the semiconductor device and it is applicable to an inspecting apparatus for a metal layer containing Cu as a main component or the like. In this case, an electron backscattering diffraction pattern (EBSP) method, a scanning electron microscope with an accelerating voltage of 5 kV or less, a scanning ion microscope, a transmission-type electron microscope, an atomic force microscope, and the like can be used for examining grain boundary characteristics of the metal layer containing Cu as a main component.

The semiconductor device and the inspecting technique for the same according to the present invention are suitable for a semiconductor device having at least one layer of Cu wiring provided in an insulating layer provided on a semiconductor substrate via an composite layer comprising a barrier layer and a seed layer on the barrier layer and provided between the Cu wiring and the insulating layer, and an electronic part containing the semiconductor device can be utilized as a constituent part in a mobile phone, a portable electronic apparatus, an apparatus for an automobile, and an automobile.

What is claimed is:

1. A semiconductor device comprising: a semiconductor substrate; an insulating layer provided on the semiconductor substrate; and at least one layer of Cu wiring provided in the insulating layer via an composite layer including a barrier layer and a seed layer on the barrier layer and provided between the Cu wiring and the insulating layer, wherein the barrier layer includes Ta crystal;

the seed layer includes an alloy crystal layer of Cu and Al;

the Cu wiring is formed such that 60% or higher of all grain boundaries configuring crystals of the Cu wiring are coincidence boundaries of Sigma value 27 or less in at least one cross section of the Cu wiring and that a total value of orientations of a (111) plane and a (200) plane in the Cu wiring is 94%;

the orientation of the (111) plane of Cu wiring is 93% and the orientation of the (200) plane is 1%; and the barrier layer comprises a single layer of Ta crystal, or a composite layer of Ta crystal and TaN crystal.

2. A semiconductor device comprising: a semiconductor substrate; an insulating layer provided on the semiconductor substrate; and at least one layer of Cu wiring provided in the insulating layer via an composite layer including a barrier layer and a seed layer on the barrier layer and provided between the Cu wiring and the insulating layer, wherein the barrier layer includes Ru crystal;

the seed layer includes an alloy crystal layer of Cu and Al;

the Cu wiring is formed such that 40% or higher of all grain boundaries configuring crystals of the Cu wiring are twin boundaries of Sigma value 3 in at least one cross section of the Cu wiring and that a total value of orientations of a (111) plane and a (200) plane in the Cu wiring is 98%;

the orientation of the (111) plane of the Cu wiring is 44% and the orientation of the (200) plane is 54%; and the barrier layer comprises a single layer of Ru crystal, or a composite layer of Ru crystal and RuN crystal.

* * * * *